United States Patent
Schmidt et al.

(10) Patent No.: US 6,322,119 B1
(45) Date of Patent: Nov. 27, 2001

(54) ROBOTS FOR MICROELECTRONIC WORKPIECE HANDLING

(75) Inventors: Wayne J. Schmidt, Meridian, ID (US); Thomas H. Oberlitner, Kalispell, MO (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/386,590

(22) Filed: Aug. 31, 1999

Related U.S. Application Data

(63) Continuation of application No. PCT/US99/15567, filed on Jul. 9, 1999.

(51) Int. Cl.$^7$ ..................................................... B66C 1/42
(52) U.S. Cl. ................................. 294/103.1; 414/744.8; 901/39; 901/47; 294/907
(58) Field of Search ..................... 414/744.1, 744.8, 414/941; 901/30, 39, 46, 47; 294/34, 103.1, 1.1, 907

(56) References Cited

U.S. PATENT DOCUMENTS

| | | | |
|---|---|---|---|
| 4,451,197 | * 5/1984 | Lange | 414/737 |
| 4,639,028 | * 1/1987 | Olson | 294/34 |
| 4,670,126 | 6/1987 | Messer et al. | |
| 4,770,590 | 9/1988 | Hughes et al. | |
| 4,944,650 | * 7/1990 | Masumoto | 294/103.1 |
| 5,178,512 | 1/1993 | Skrobak | |
| 5,442,416 | 8/1995 | Tateyama et al. | |
| 5,460,478 | 10/1995 | Akimoto et al. | |
| 5,571,325 | 11/1996 | Ueyama et al. | |
| 5,639,206 | 6/1997 | Oda et al. | |
| 5,711,646 | 1/1998 | Ueda et al. | |
| 5,746,565 | 5/1998 | Tepolt | |
| 5,759,006 | 6/1998 | Miyamoto et al. | |
| 5,765,889 | 6/1998 | Nam et al. | |

FOREIGN PATENT DOCUMENTS

WO 00/02808 A1  1/2000 (WO).

\* cited by examiner

Primary Examiner—Donald W. Underwood
(74) Attorney, Agent, or Firm—Perkins Coie LLP

(57) ABSTRACT

An improved conveyor system for transporting a microelectronic workpiece within a processing tool is set forth. The conveyor system includes a transport unit slidably guided on a conveyor rail for transporting and manipulating the workpieces. The transport unit includes a vertical member which is connected to a base end of a two section robot arm. The robot arm includes an end effector at a distal end thereof which is actuated to grip a surrounding edge of a workpiece. A first rotary actuator is arranged to rotate the vertical member about its axis to rotate the entire robot arm. A second rotary actuator is positioned to rotate the second section of the robot arm, via a belt, with respect to the first section of the robot arm. A third rotary actuator is arranged to rotate the end effector about its horizontal axis. The third rotary actuator permits the end effector to flip the microelectronic workpiece between a face up and a face down orientation. In a further aspect of the invention, two transport units are mounted to slide laterally on the conveyor rail. The transport units include a vertical space between respective end effectors and the first sections of the robot arms to allow wafers carried by the end effectors to overlap in plan. Two different end effectors are disclosed, a plunger activated gripping device and a vacuum operated gripping device which uses raised pad areas, vacuum ports and locating pins.

16 Claims, 21 Drawing Sheets

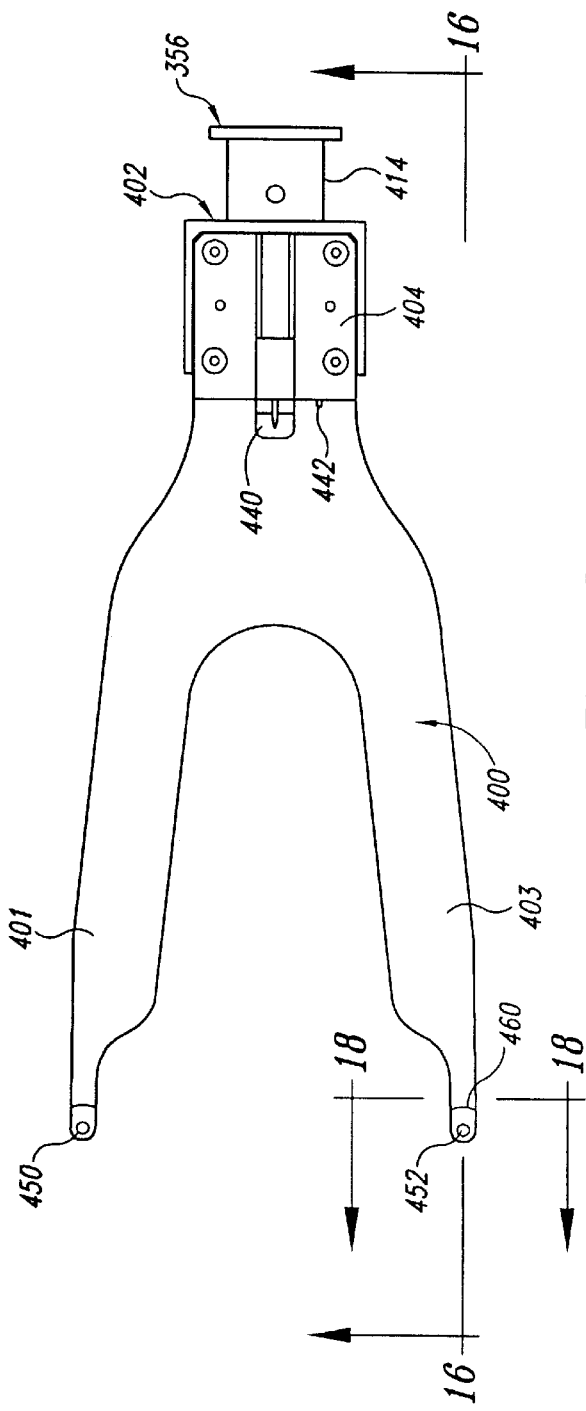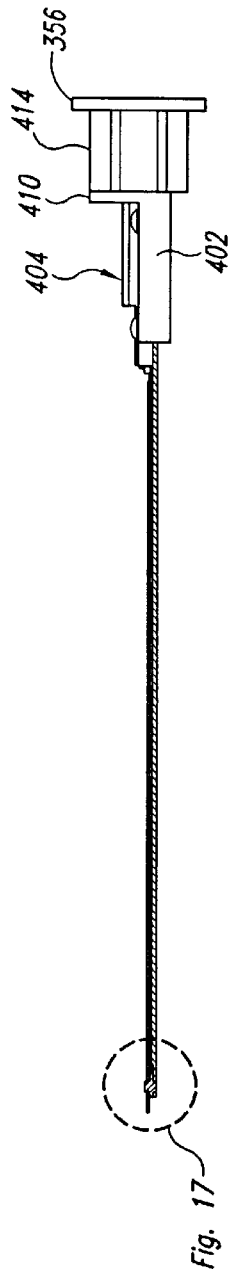
Fig. 15
Fig. 16
Fig. 17

ROBOTS FOR MICROELECTRONIC WORKPIECE HANDLING

CROSS-REFERENCE TO RELATED APPLICATIONS

This is a continuation application of International PCT Patent Application No. PCT/US99/15567, designating the U.S., filed Jul. 9, 1999, entitled ROBOTS FOR MICROELECTRONIC WORKPIECE HANDLING, which claims priority from U.S. patent application Ser. No. 09/114,105, filed Jul. 11, 1998.

STATEMENT REGARDING FEDERALLY SPONSORED RESEARCH OR DEVELOPMENT

Not applicable

BACKGROUND OF THE INVENTION

There are a wide range of apparatus types for processing workpieces that ultimately become microelectronic devices. As the microelectronics industry advances toward efficient and economical mass production of the devices, the demands on the apparatus used in processing of the workpieces have increased. Increasingly, automation of the apparatus is being used to meet these ever-increasing demands. More particularly, many of the increased demands relate to automated devices for handling the microelectronic workpieces during processing.

An automated apparatus used for processing a microelectronic workpiece, such as a semiconductor workpiece, is disclosed in U.S. Ser. No. 08/991,062, filed Dec. 15, 1997, and titled "Semiconductor Processing Apparatus Having Lift and Tilt Mechanism", which is hereby incorporated by reference. This apparatus utilizes a plurality of workpiece processing modules or stations for performing various processing steps. Workpiece transport units are used to access workpiece cassettes and transfer workpieces throughout the processing apparatus. A workpiece conveyor supports and guides the workpiece transport units for transferring individual workpieces between workpiece interface modules and the workpiece processing modules or stations. The workpiece conveyor also includes a transport unit guide, such as an elongated rail, which defines a path for one or more workpiece transport units within the apparatus. The workpiece transport units which move along the rail are configured to have a workpiece transfer arm assembly having an end with a vacuum effector for holding a workpiece. The transfer arm assembly can be adjusted in vertical elevation and can be rotated about the vertical axis for precise positioning of the effector and the workpiece.

Workpieces are typically handled and stored with the face to be processed (the "front" face) oriented facing upwardly. This orientation avoids contact on the front face by the supporting structure. Some processing modules, on the other hand, require the workpiece to be oriented with the face to be processed facing downwardly. To accommodate such requirements, some processing modules such as electroplating reactors, utilize a processing head which can be "flipped", i.e., rotated, between a first position in which the processing head is positioned to receive the workpiece with a front side of the workpiece facing up and a second positioned in which the front side of the workpiece faces down for processing.

Making provision for each processing module or station to "flip" the workpiece for processing requires complicated head operator mechanisms for rotating the processing heads. Such operator mechanisms can require substantially heavy or large structures for rotating the processing heads, and can require significant overhead operating room for the rotational movement.

The present inventors have recognized that reducing or eliminating the requirement for processing modules to turn over or flip a workpiece for processing would simplify the overall workpiece apparatus. The present inventors have also recognized that cost savings and process simplicities would be enhanced by eliminating the requirement for flipping the workpiece. Still further, the inventors have recognized that a wider range of processing stations of different types may be integrated into a single processing tool. Such processing stations may have varying wafer orientation requirements, one station requiring a front-face up orientation for processing while another station requires a front-face down orientation for processing. An apparatus that addresses each of these recognized problems is set forth.

Additionally, the present inventors have recognized that it would be advantageous to provide a workpiece conveyor with transport unit slidable thereon which minimizes the required working space or "footprint" of the conveyor and transport units operating between laterally disposed process units. An apparatus which provides this advantage is set forth.

SUMMARY OF THE INVENTION

The present invention is directed to a workpiece conveyor system that is used for transporting individual workpieces between workpiece processing stations and the/or interface modules in a workpiece processing apparatus. The workpiece conveyor system includes an improved workpiece transport unit that carries the workpieces within the apparatus on, for example, a conveyor rail or the like. The transport unit includes a vertical member extending from a housing. An arm member extends from the vertical member at a base end of the arm member. A workpiece-holding end effector is disposed at a distal end of the arm member and is selectively driven in rotation about a horizontal axis to "flip" the workpiece between a face-up orientation and a face-down orientation. The effector is preferably configured to grip an edge of a workpiece, such as a semiconductor wafer, and can have a workpiece presence sensor for informing a control unit that a workpiece is present on the effector.

In accordance with one embodiment of the present invention, the workpiece transport unit provides five "axes" of movement. To this end, the transport unit can be driven linearly on the rail along a horizontal axis (Y). The vertical member can be raised or lowered vertically along a vertical axis (Z1). The arm member can be rotated about the vertical axis (Z1) and a distal portion of the arm member can be rotated about the vertical axis (Z2). The end effector can rotate or "flip" about a horizontal axis (R), for example, to orient the workpiece in either the front-face up or front face down orientation. To execute such rotation, the arm member preferably includes a rotary actuator mounted within the arm member to turn the end effector about the horizontal axis.

By providing a workpiece transport unit with increased flexibility of movement, including a rotation about a horizontal axis, more expensive, heavy and complicated mechanisms for flipping workpieces at a plurality of process modules is avoided. Additionally, it becomes possible to integrate processing stations having different workpiece orientation requirements into a single processing apparatus.

In a further aspect of the invention, a workpiece transport unit is provided having a vacuum gripping mechanism for holding a workpiece to the end effector. The vacuum gripping mechanism includes a plurality of raised pads for pressing against an edge region of the workpiece, and vacuum ports through the pads for urging the workpiece onto the pads.

In a still further aspect of the invention, two workpiece transport units are slidable on opposite lateral sides of a guide rail structure. At least one of the transport units includes a first end effector which is elevated above an adjacent section of its respective first robot arm, providing a vertical space therebetween. The vertical space is sufficiently projected in a horizontal direction for the respective other end effector of the other transport unit, operating at a lower elevation, to pass under the first end effector and over the first robot arm. Thus, wafers held by the two end effectors can be overlapped in plan, and the two transport units can be moved longitudinally along the conveyor rail, together, or individually with respect to each other, without interference between end effectors or wafers held thereby. This arrangement minimizes the lateral footprint needed between opposing process units of the tool.

Numerous other advantages and features of the present invention will become readily apparent from the following detailed description of the invention and the embodiments thereof, from the claims and from the accompanying drawings in which details of the invention are fully and completely disclosed as part of this specification.

BRIEF DESCRIPTION OF THE SEVERAL VIEWS OF THE DRAWINGS

FIG. 15 is a plan view of the end effector of FIG. 13;

FIG. 16 is a sectional view taken generally along line 16—16 of FIG. 15;

DETAILED DESCRIPTION OF THE INVENTION

Figure 1:
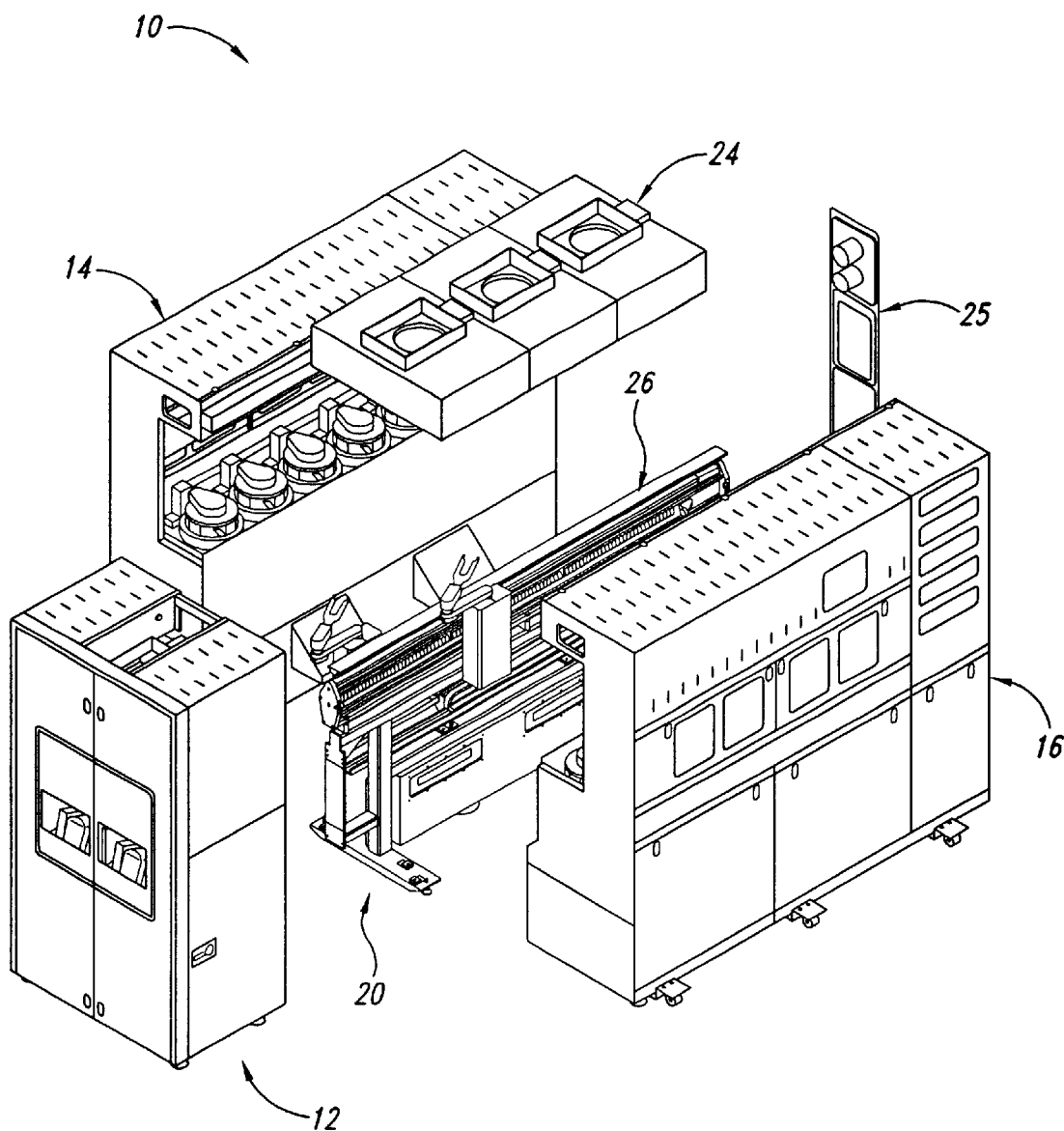
FIG. 1 is an exploded perspective view of a workpiece processing tool incorporating an improved workpiece conveyor system constructed in accordance with one embodiment of the present invention.

While this invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

FIG. 1 illustrates an exemplary modular workpiece processing apparatus 10 that may use the improved conveyor system of the present invention. As illustrated, apparatus 10 includes an input/output assembly 12, and left and right processing modules 14, 16. The apparatus 10 also includes the improved workpiece conveyor system 20, a top exhaust assembly 24, and an end panel 25. As illustrated, left and right processing modules 14, 16, which each include a plurality of workpiece processing stations, may be secured to one another about the workpiece conveying system 20 to form a processing chamber having a longitudinally disposed inlet and outlet. Preferably, workpiece conveyor 20 is disposed in the processing chamber so that it can access each of a plurality of workpiece cassette interface modules within the input/output assembly 12 and, further, can access each workpiece processing station within the left and right processing modules 14, 16.

A plurality of the processing modules 14, 16 may be secured in an end-to-end configuration to thereby provide an extended processing chamber capable of performing a substantial number of processes on each workpiece or, in the alternative, process a larger number of workpieces concurrently. In such instances, the workpiece conveying system 20 of one apparatus 10 is programmed to cooperate with the workpiece conveying system 20 of one or more prior or subsequent conveying systems 20.

Figure 2:
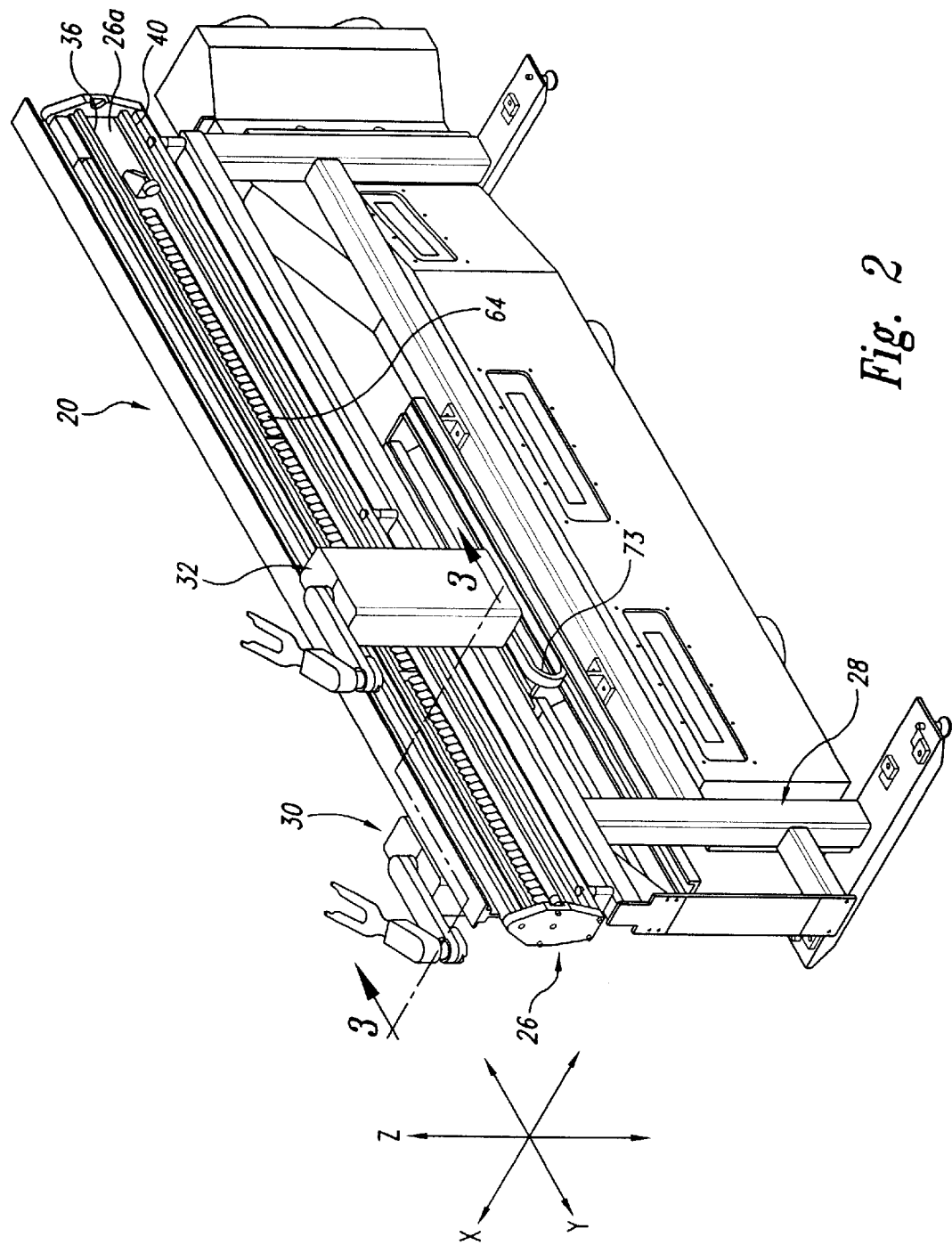
FIG. 2 is a perspective view of the improved workpiece conveyor system shown in FIG. 1.

FIG. 2 illustrates further details of the workpiece conveyor 20 for transporting workpieces throughout the processing apparatus 10 of FIG. 1. As shown, the workpiece conveyor 20 generally includes one or more workpiece transport units 30, 32 that are coupled for movement along workpiece transport unit guide 26. The transport unit guide 26 preferably comprises an elongate spine 26a mounted on a frame 28. Alternatively, transport unit guide 26 may be formed as a track or other elongate configuration for guiding workpiece transport units 30, 32 thereon. The length and shape of workpiece conveyor 20 and transport unit guide 26 may be varied, and configured to permit the workpiece transport units 30, 32 to access each processing station within the apparatus 10.

In the illustrated embodiment, the workpiece transport unit guide 26 includes a spine that supports a pair of upper guide rails 36, 38 mounted on opposite sides of the upper portion of spine 26a and a pair of lower guide rails 40, 42 mounted on opposite sides of the lower portion of spine 26a. Each workpiece transport unit 30, 32 preferably engages a respective pair of the upper and lower guide rails 36, 40 and 38, 42. Each pair of guide rails can mount one or more transport units along the spine 26a.

Each workpiece transport unit 30, 32 is powered along the respective path by a suitable driver. More specifically, drive operators 61, 64 are mounted to respective sides of transport unit guide 26 to provide controllable axial movement of workpiece transport units 30, 32 along the transport unit guide 26. The drive operator 61, 64 may be linear magnetic motors for providing precise positioning of workpiece transport units 30, 32 along the guide 26. In particular, drive operators 61, 64 are preferably linear brushless direct current motors. Such preferred drive operators 61, 64 utilize a series of magnetic segments which magnetically interact with a respective electromagnet 69 mounted on each of the workpiece transport units 30, 32 to propel the units along the transport unit guide 26.

Cable guards 72, 73 may be connected to respective workpiece transport units 30, 32 and frame 28 for protecting communication or power cables therein. Cable guard 72, 73 may comprise a plurality of interconnected segments to permit a full range of motion of workpiece transport units 30, 32 along transport unit guide 26.

Figure 3:
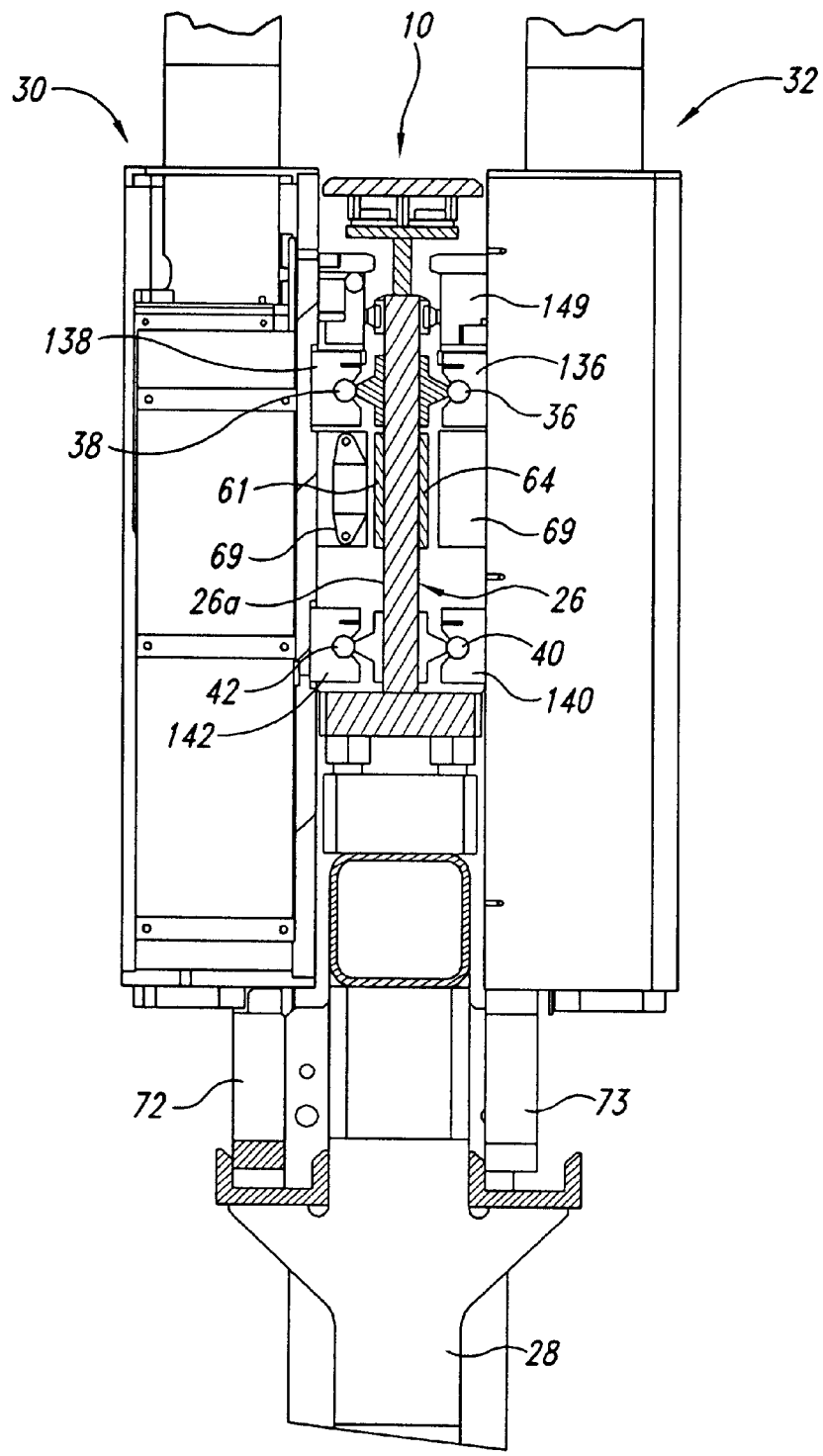
FIG. 3 is a sectional view taken generally along line 3—3 of FIG. 2.

As shown in FIG. 3, the workpiece transport unit 30 is coupled with a first side of the spine 26a of guide 26, and the workpiece transport unit 32 is coupled to a second side of the spine 26a. Each workpiece transport unit 30, 32 can include four linear bearings 136, 140, 138, 142 for engagement with linear guide rails 36, 40, 38, 42 respectively.

Figure 4:
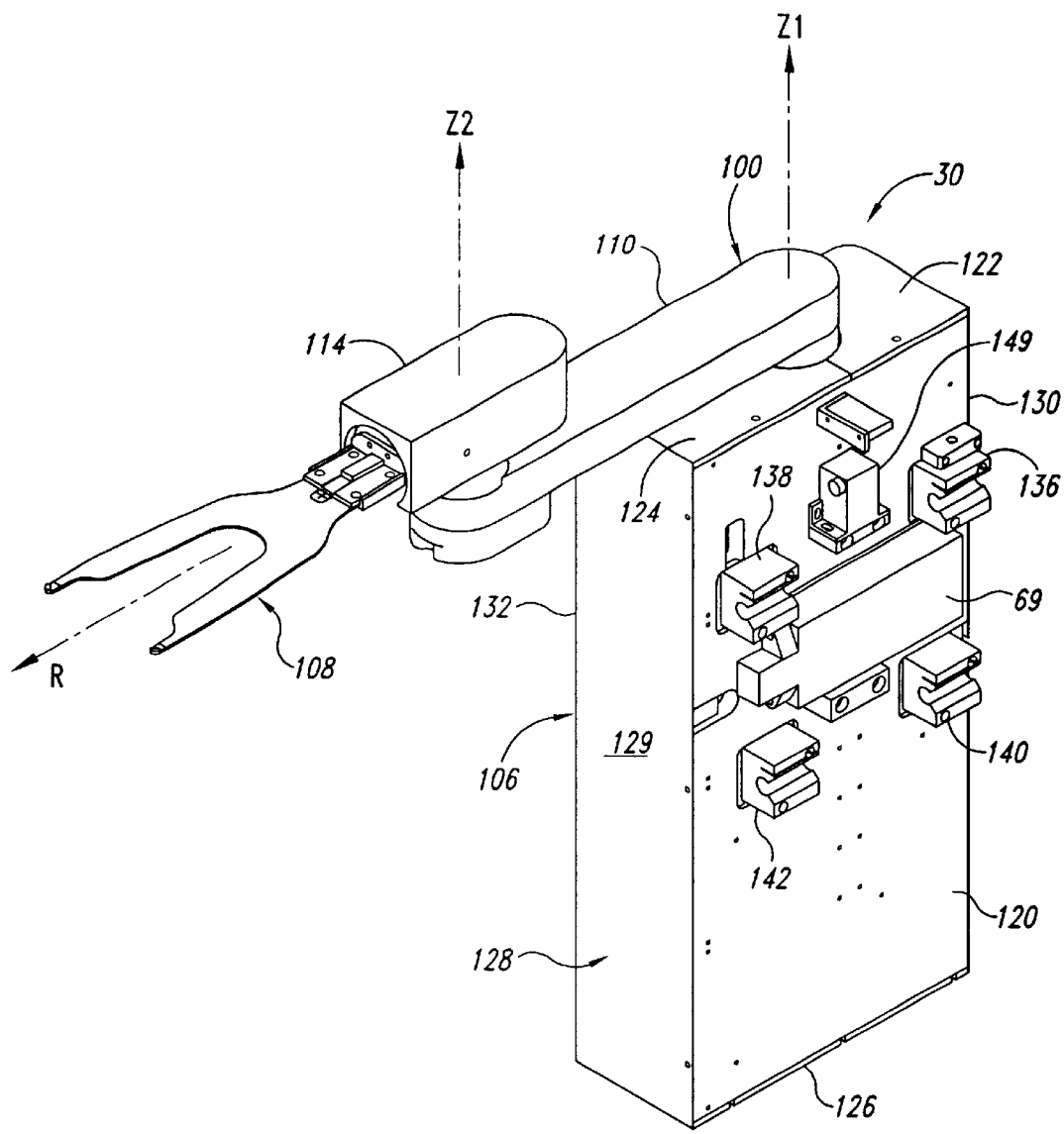
FIG. 4 is a perspective view of a workpiece transport unit constructed in accordance with one embodiment of the present invention.

FIG. 4 illustrates a workpiece transport unit 30 which is substantially identical to the workpiece transport unit 32. For simplicity, only the transport unit 30 will be described in detail. The transport unit 30 includes a robot arm or arm member 100 extending horizontally from a transport unit housing 106 at a base end of the arm member, to an edge-grip end effector 108 at a distal end of the arm member. The arm member 100 includes a first arm section 110 rotatably connected to a second arm section 114. The first arm section 110 is rotatable about a vertical axis Z1 with respect to the housing 106. The second rotatable arm section 114 is rotatable about a vertical axis Z2 with respect to the first arm section 110. The end effector 108 is rotatable about a horizontal axis (or "flip" axis) R, perpendicular to the vertical axes Z1 and Z2.

The housing 106 includes a vertically arranged base plate 120, a first top cover plate 122, a second top cover plate 124, a bottom cover plate 126 and a U-shaped shroud 128. The U-shaped shroud 128 comprises side walls 129, 130 and a back wall 132.

Mounted to the base plate are the four linear bearings 136, 138, 140, 142 which receive the guide rails as shown in FIG. 3. Arranged between the upper linear bearings 136, 138 and the lower linear bearings 140, 142 is a brushless motor 69, which acts on the drive operator 61 of the guide 26 (shown in FIGS. 2 and 3). A head reader linear encoder 149 provides a position signal corresponding to the position of the transport unit 30 on the guide 26, to a control unit used to control the transport unit.

Figure 5:
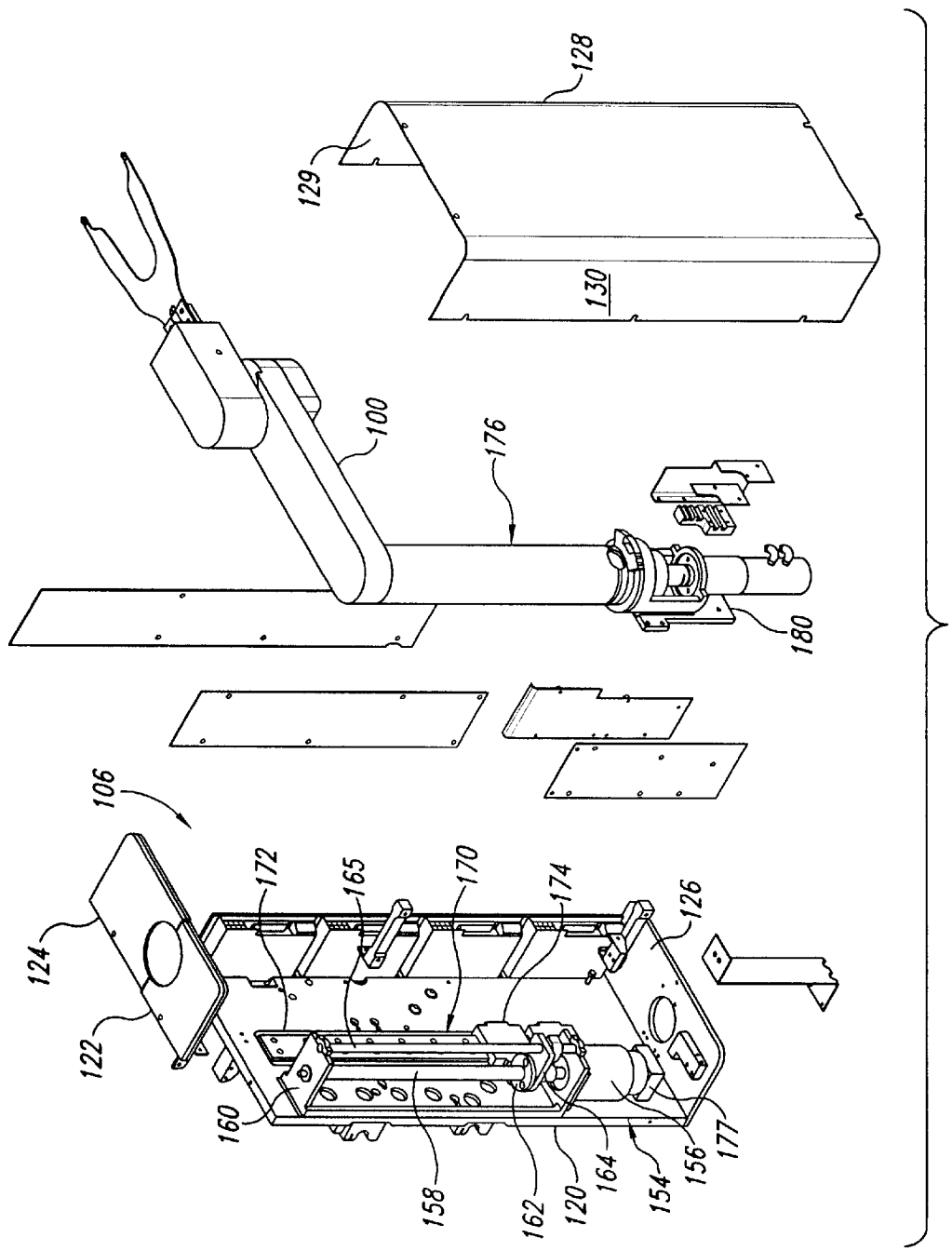
FIG. 5 is an exploded perspective view of the workpiece transport unit shown in FIG. 4.

FIG. 5 illustrates the various components that are disposed inside of the housing 106. As illustrated, a lift assembly 154 and cooperating components of arm assembly 100 are disposed within the housing 106.

The lift assembly 154 includes the various components used drive the arm assembly 100 along vertical axis Z1. To this end, the lift assembly 154 includes a lead screw motor 156 which turns a threaded lead screw 158 that, and turn, is disposed for rotation within a lift bracket 160. A lead screw nut 162 is threaded onto the lead screw 158 and fastened to a lift nut adaptor 164. Vertical movement within the lift assembly 154 is guided by a linear rail 170. Thus, rotation of the lead screw 158 about its axis will advance the nut 162 and the adaptor 164 upwardly, axially along the lead screw 158. Reverse rotation of the lead screw motor 156 will lower the nut 162 and adaptor 164 along the lead screw 158. A signal corresponding to the vertical position of the arm assembly 100 along the vertical axis Z2 is provided by an absolute position sensor 165.

The arm member 100 is connected to vertical rail 176 for movement along the vertical axis Z2. A vertical linear bearing assembly 170 having a track 172 and a sliding element 174 is arranged adjacent to the lift assembly 154. The vertical member includes at a base end thereof a carrier plate 180 which is connected to the moving element 174 and the adaptor 164 such that the vertical rail 176 and the arm member 100 can be vertically raised and lowered by the adaptor 164 through actuation of the lead screw motor 156. The linear bearing assembly 170 ensures a precise and stable vertical lifting of the vertical member. A lift encoder 177 is connected to the driven shaft of the lead screw motor 156 to send a precise lift position signal to a control for the transport unit.

Figure 6A:
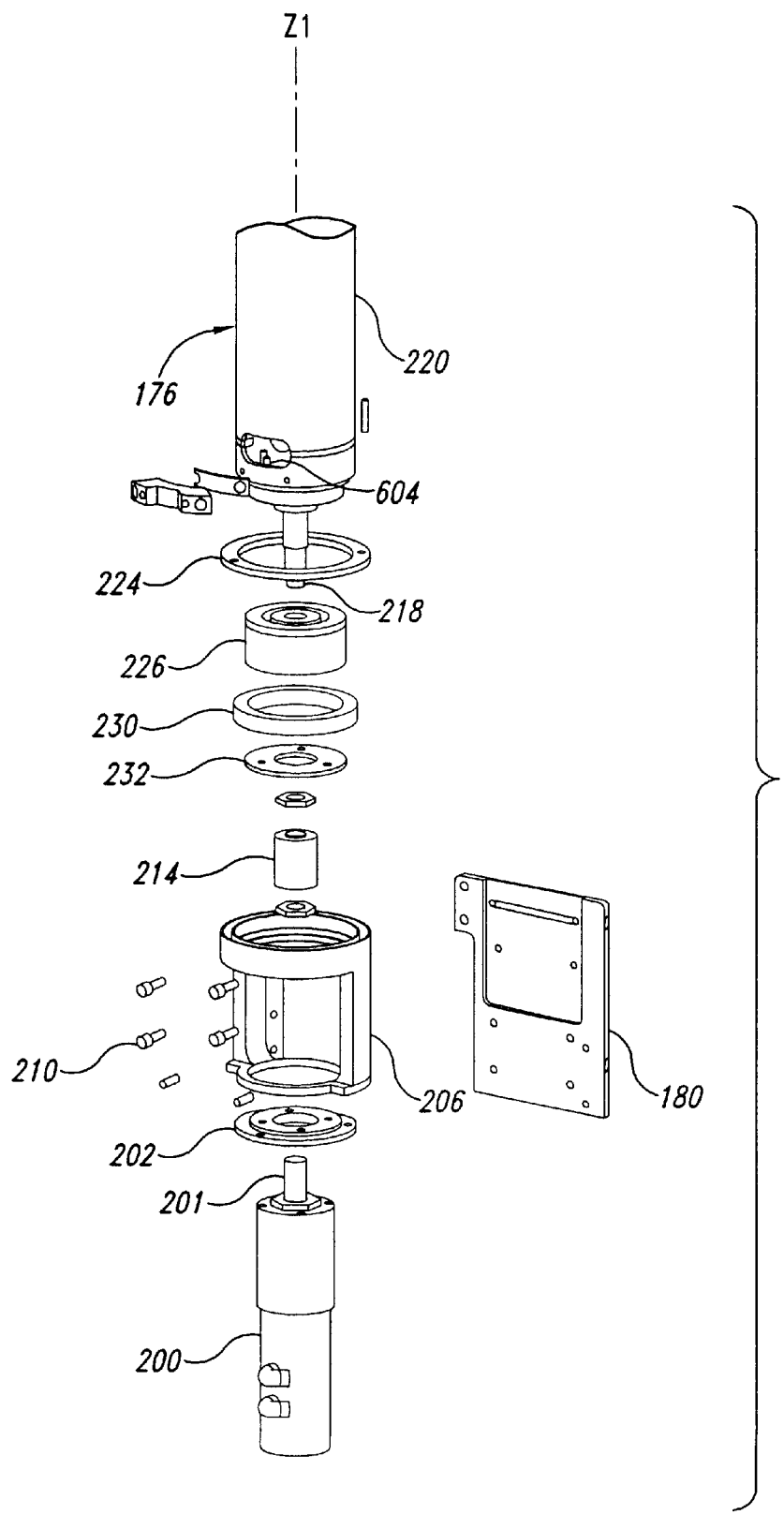
FIG. 6A is a partial exploded perspective view of the robot arm components of the transport units of FIG. 5.
Figure 12:
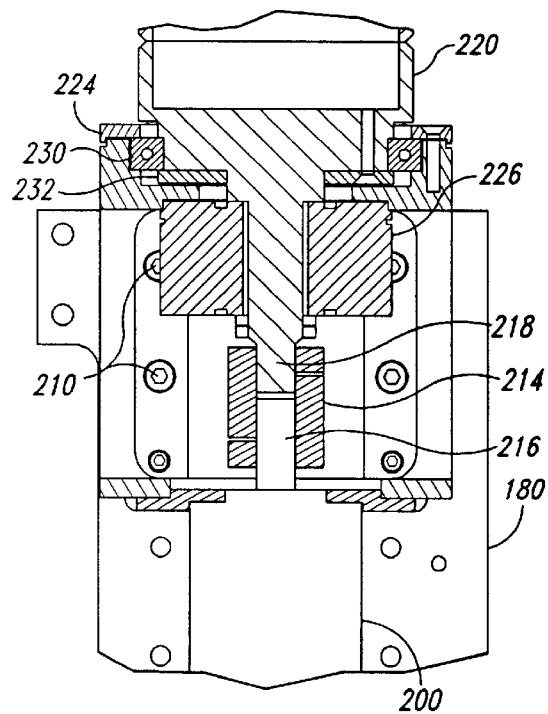
FIG. 12 is an enlarged fragmentary sectional view taken from FIG. 8.
Figure 13:
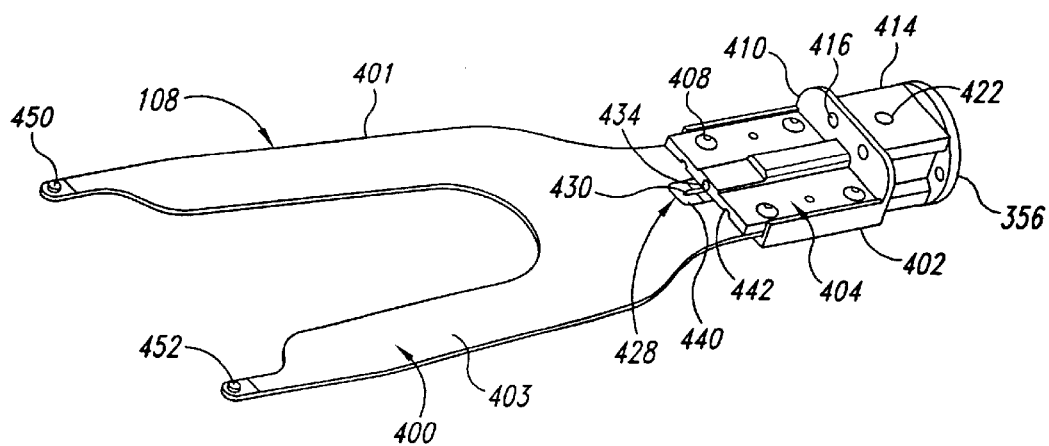
FIG. 13 is an enlarged perspective view of one embodiment of an end effector suitable for use in the workpiece transport unit shown in FIG. 4.

FIGS. 6A and 12 illustrate a first rotational movement motor 200 which, by rotation of an output shaft 201, effects rotation of the vertical member 176 and the first arm section 110 about the vertical axis Z1 with respect to the housing 106. The motor 200 is connected by a motor mount 202 to a lower housing 206. The lower housing is connected by screws 210 to the carrier plate 180. A coupling 214 connects the output shaft 201 of the motor 200 to an input shaft 218 of a tube assembly 220. Between the tube assembly 220 and the lower housing 206 are arranged a bearing retainer 224, a resolver sensor 226, a roller bearing 230 (shown schematically), and a lower bearing retainer 232. The resolver sensor 226 sends a precise rotary position signal of the tube assembly 220 with respect to the housing 106 to a control of the transport unit.

Figure 6B:
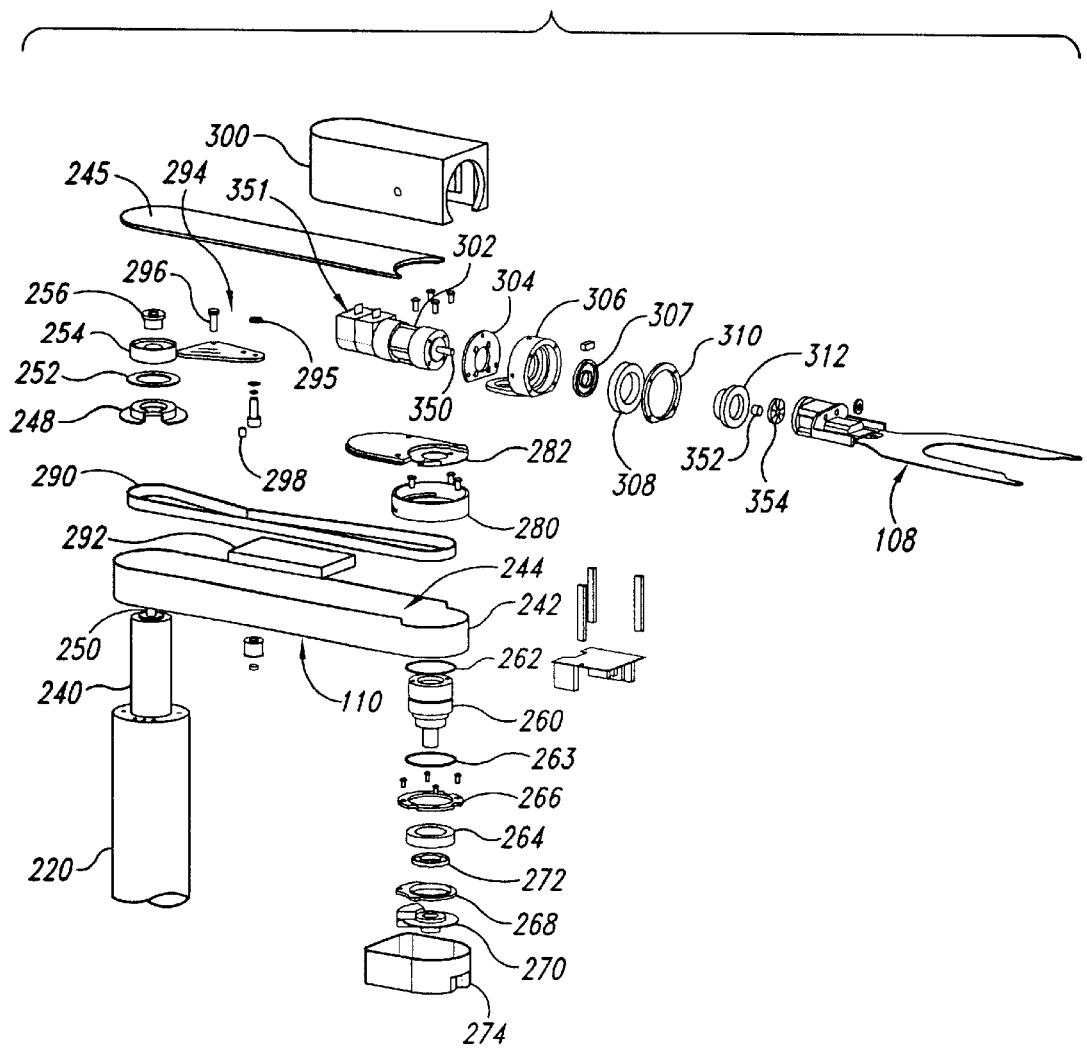
FIG. 6B is a partial exploded perspective view of the robot arm components of FIG. 6A, FIG. 6B being a continuation of FIG. 6A.
Figure 7:
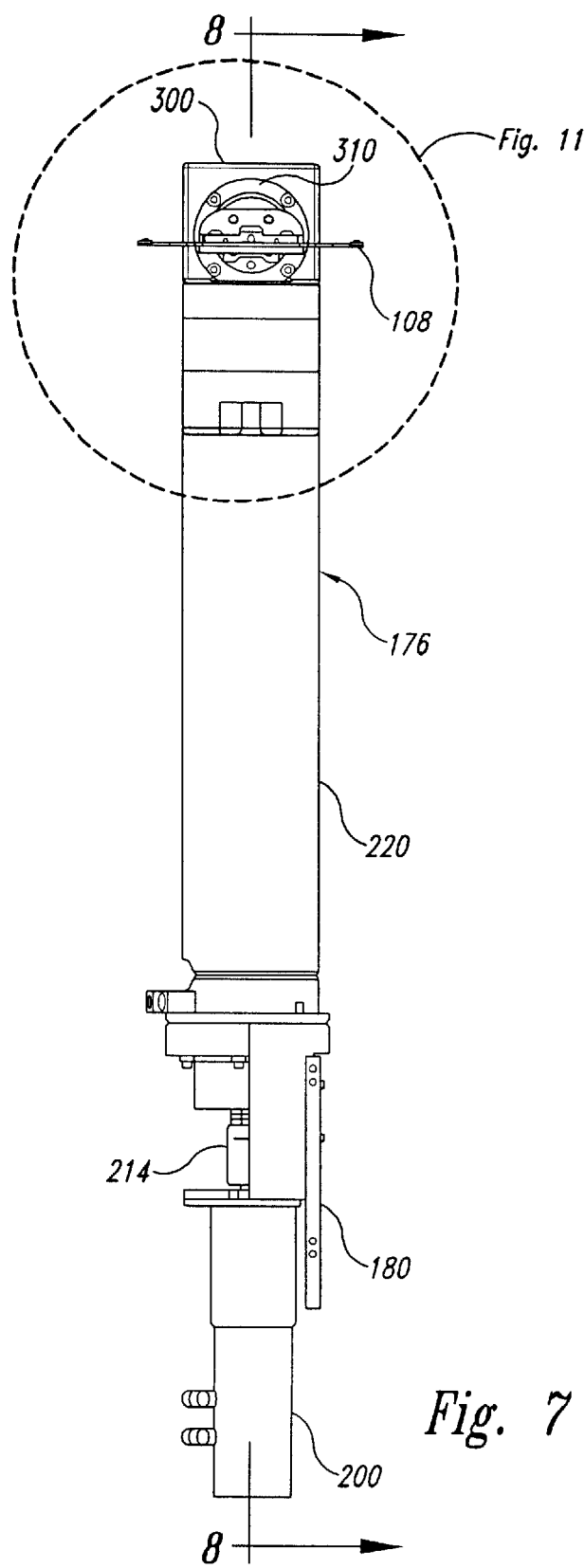
FIG. 7 is a side view of the robot arm components of FIGS. 6A, 6B, as assembled.
Figure 8:
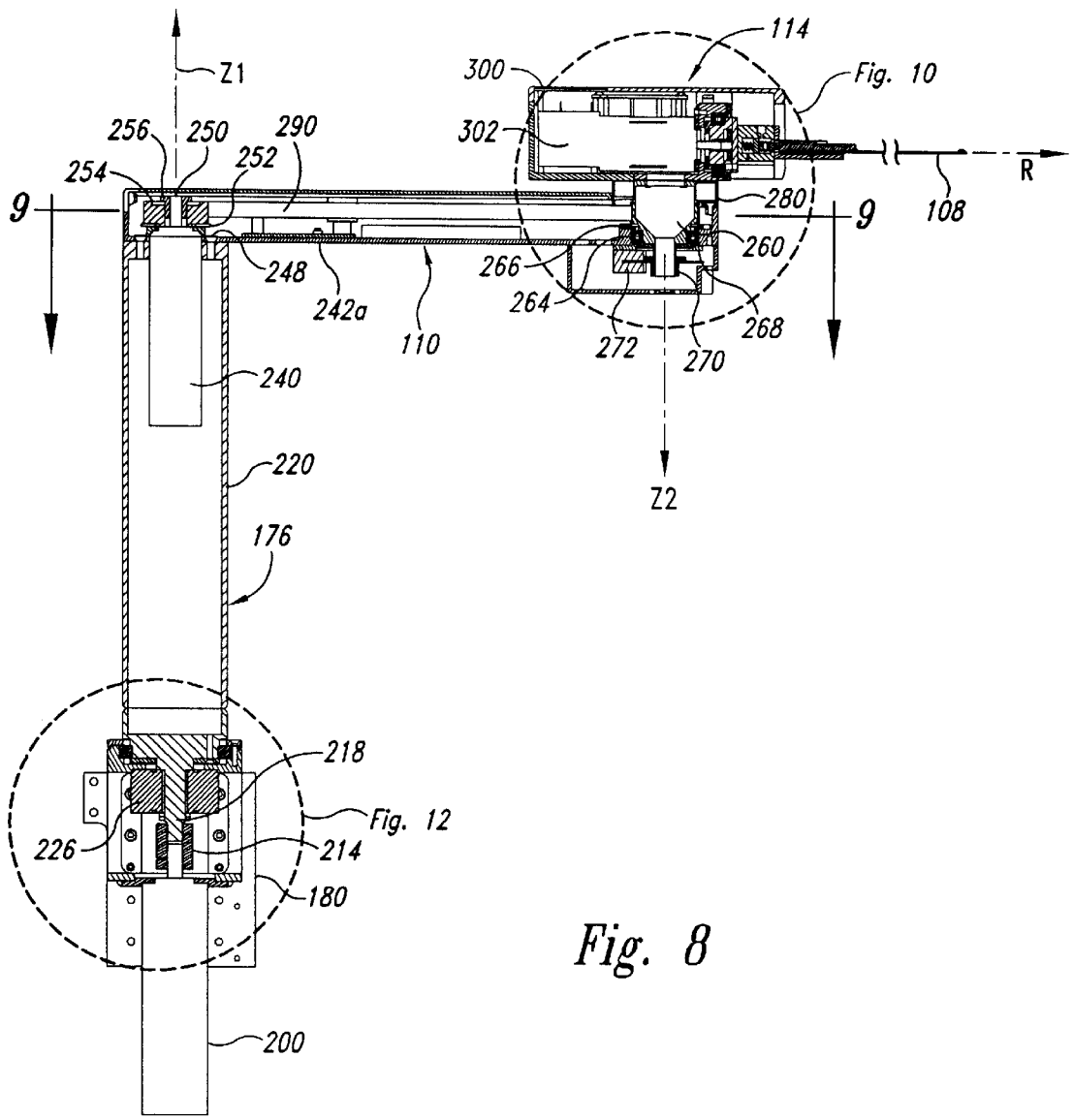
FIG. 8 is a sectional view taken generally along line 8—8 of FIG. 7.
Figure 9:
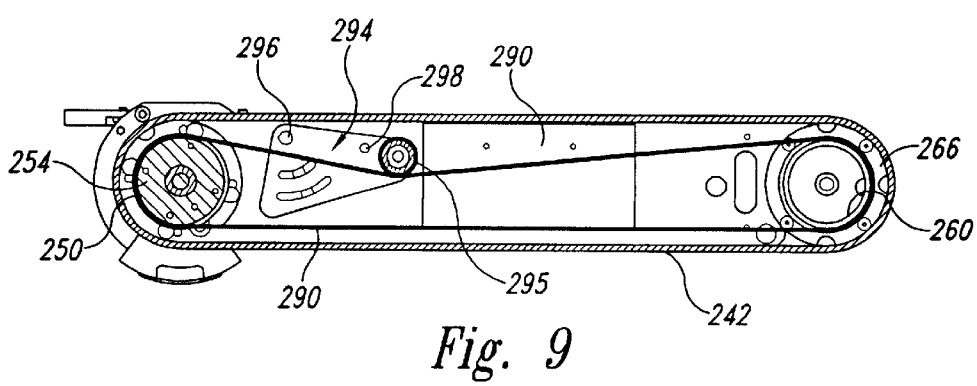
FIG. 9 is a sectional view taken generally along line 9—9 of FIG. 8.

FIGS. 6B, 8 and 9 illustrate the connection of tube 220 to a lower housing 242 of the first arm section 110. Rotation of the tube 220 rotates the lower housing 242 and the first arm section 110 about the vertical axis Z1. A top cover 245 fits over the lower housing 242 to form a substantially closed volume 244 in which these components are held.

FIGS. 6B and 8 through 10 illustrate components for imparting rotation of the second arm section 114 about the vertical axis Z2. As shown, a second rotational motor 240 is housed within the tube 220 and the lower housing 242. The motor 240 is vertically supported by a motor flange 248 which is fastened to a bottom wall 242a of the housing 242 and to the tube 220. The flange 248 is also fastened to a top of the motor 240 as shown in FIG. 8, by fasteners (not shown). An output shaft 250 of the motor 240 receives a pulley flange 252, a drive pulley 254 and a pulley clamp 256 which together constitute a driven pulley arrangement as shown assembled in FIG. 8. The second rotation motor 240 includes a rotary position encoder (not shown) integrated therewith. The encoder sends a rotary position signal to a control unit for control of the transport unit operation.

Figure 10:
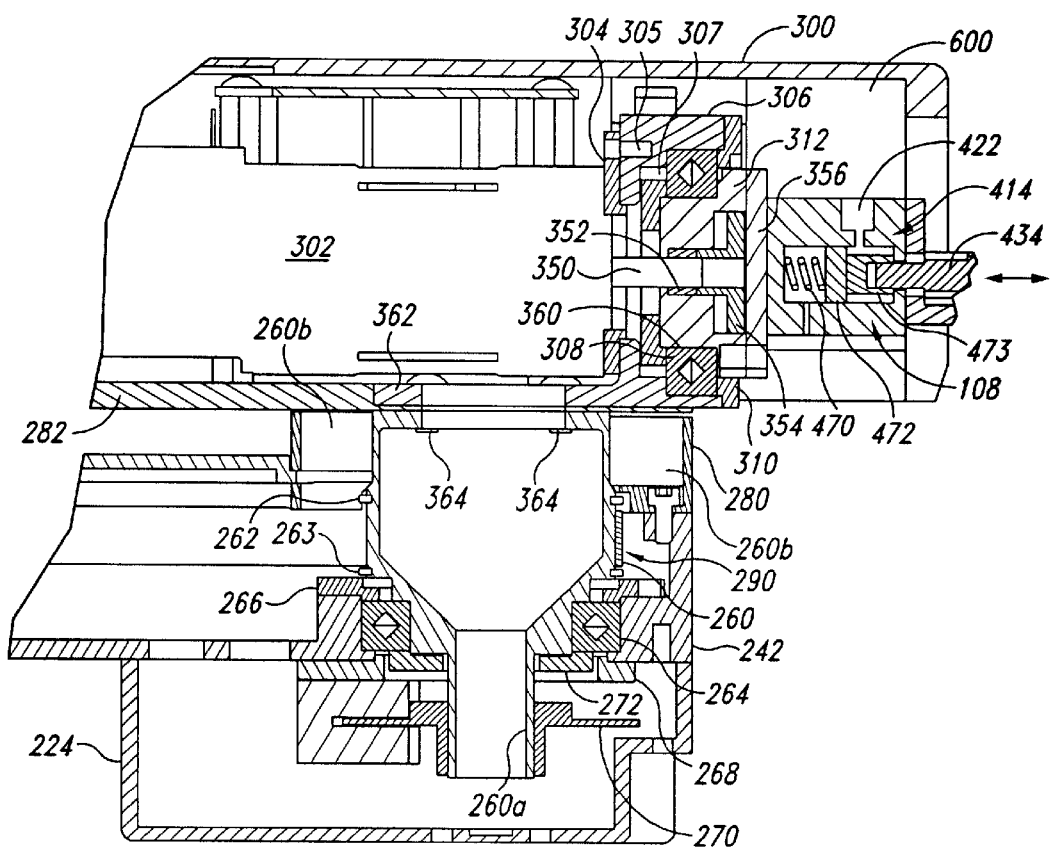
FIG. 10 is an enlarged fragmentary sectional view from FIG. 8.
Figure 11:
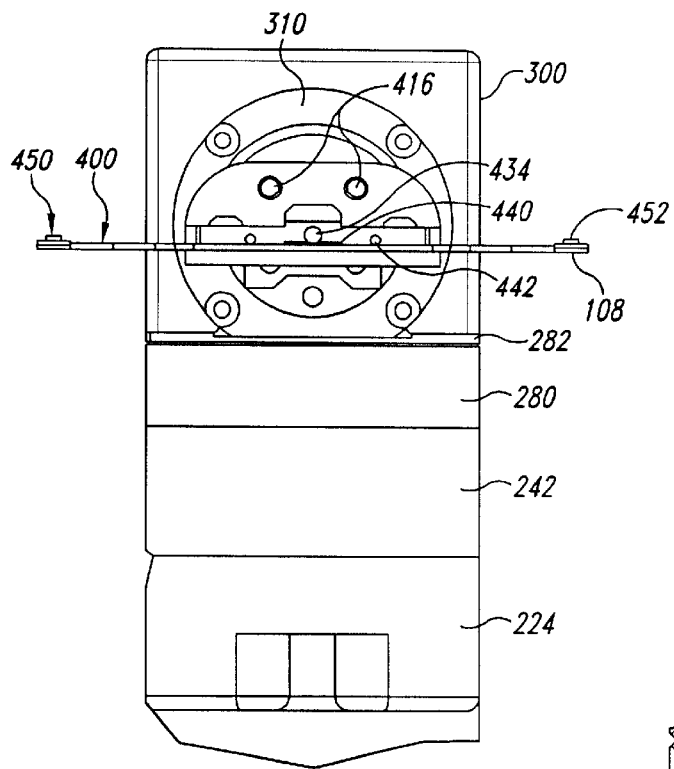
FIG. 11 is an enlarged fragmentary right side view taken from FIG. 7.

As shown more clearly in FIG. 10, a wrist torque tube 260 is mounted for rotation within the lower housing 242 and is wrapped by an arm belt 290. The arm belt 290 is driven by the drive pulley 254. A bearing 264 (shown schematically) held by a bearing retainer 266, and a torque tube retainer 272 support and guide the torque tube 260. Upper and lower retaining rings 262, 263 fit on the torque tube 260 and vertically retain the belt 290 circulating on the torque tube 260. A read head mount 268 is mounted with a rotary absolute encoder 270 to the lower housing 242. The rotary absolute encoder generates a rotational position signal of the second arm section 114 with respect to the first arm section 110. The position signal is provided to a control for the transport unit. An absolute encoder cover 274 mates with the bottom of the lower housing 242.

Located above the lower housing 242 is a robot wrist housing 280 fastened to the lower housing 242, and a bottom cover 282 fastened to the torque tube 260. Also held within the volume of the lower housing 242 is a flip axis amplifier 292, and a spring loaded belt tensioner 294.

Referring to FIG. 9, the tensioner 294 includes an idler pulley 295 for maintaining tension on the arm belt 290. The idler pulley is carried by a plate 297 which is pivoted about a pin 296 with respect to the lower housing 242. The plate is spring loaded by a spring (not shown) stretched between a fixed point on the lower housing 242 and a spring pin carried by the plate 297. The force of the spring rotates the plate to press the idler pulley 295 against the belt 290.

The second rotational motor 240 is selectively actuated to circulate the belt 290 which is wrapped around the wrist torque tube 260. This actuation swings the second arm section 114 about the vertical axis Z2.

FIGS. 6B and 10 illustrate the flip axis components which allow rotation of the effector 108 about the horizontal axis R. Located beneath a flip axis cover 300 within the second arm section 114 is a flip axis motor 302. The flip axis motor 302 is selectively actuated to rotate the end effector 108 about the horizontal axis R. The flip axis motor is connected to an actuator mount 304. A bearing housing 306 is located within the cover 300 and holds a bearing 308 (shown schematically) together with a retainer 310. A flip axis hub 312 is mounted to the end effector 108.

The flip axis motor includes an output shaft 350 connected, at a back end of the motor 302, to two rotary position encoders 351. The redundant rotary position encoders provide a signal to a control unit of the transport unit that corresponds to the rotary position of the effector 108 about the horizontal axis R with respect to the second arm section 114. The output shaft 350 is clamped to the flip axis hub 312 by the action of a clamp ring 352 and an interacting pressure flange clamp 354 which are squeezed between the flip axis hub 312 and a rear flange 356 of the effector 108. The rear flange 356 is attached by fasteners to the flip axis hub 312 (registering fastener holes shown in FIG. 6B).

The flip axis hub 312 includes an annular bearing surface 360 which is journaled for rotation by the bearing 308. The bearing 308 is held in place by the bearing retainer 310 which is attached by fasteners to the bearing housing 306 (registering fastener holes shown in FIG. 6B). The bearing housing 306 includes a base portion 362 which is fastened to the wrist torque tube 260 and to the bottom cover 282 by fasteners 364. The actuator mount 304 is attached by fasteners 305 to a rear side of the bearing housing 306. The actuator mount 304 is attached by fasteners to a front side of the motor 302 (registering fastener holes are shown in FIG. 6B).

As illustrated in FIG. 10, a pneumatic cylinder 414 includes a spring 470 which exerts a thrusting force on a piston 472 which is connected to the plunger 434 via a threaded socket 473. Pressurized air introduced into the port 422 acts on the piston 472 in opposition to the force of expansion of the spring and retracts the plunger 434 (to the left as shown in FIG. 10).

As can be seen in FIG. 10, an annular space 600 is provided around the pneumatic cylinder 414 and beneath the flip axis cover 300 for the purpose of containing pneumatic tubing and signal and power conductors wound in a loose fashion to allow for rotation of the end effector 108. This pneumatic tubing as well as the conductors can be routed from the space 600 backwardly, partly through the second arm section 114, and downwardly through a central passage 260a of the torque tube 260. Other conductors, such as from the motor 302 and the encoders 351 are routed via printed circuit cables disposed in cavities 260b. This arrangement winds up or unwinds these cables about torque tube 260 to thereby allow rotation of arm section 114 about axis Z2. The tubing and conductors can then be routed through the encoder housing 224, upwardly into the volume 244 provided by the lower housing cover 245, and down through the vertical member 176, to exit the tube 220 at the opening 604 as shown in FIG. 6A. To allow sufficient flexibility for the relative rotation between the first and second arm sections 110, 114, the conductors and tubing can be loosely coiled within the torque tube 260 before exiting.

FIGS. 13 through 16 illustrate one embodiment of the edge-gripping end effector 108. As illustrated, the end effector 108 includes a paddle 400 extending from a base portion 400a (shown in FIG. 19) located over a bracket 402. The paddle 400 is substantially Y-shaped with two substantially parallel prongs, a first prong 401 and a second prong 403. A gripper body 404 is connected by fasteners 408 to the bracket 402 and acts to clamp the base portion 400a of the paddle 400 between the gripper body 404 and the bracket 402. The pneumatic actuator 414 is connected to an upstanding leg 410 of the bracket 402, connected by a plurality of fasteners 416. The pneumatic actuator 414 is connected to the rear flange 356 of the effector 108, by fasteners (not shown). The pneumatic actuator 414 includes the pressurized air inlet port 422 which can be a threaded opening for receiving a tube fitting of an air supply line (not shown).

The gripper body 404 includes a guide tab 428 at a front end thereof, overlying the paddle 400. The guide tab includes, on a top surface thereof, a semicylindrical groove 430. A plunger 434 is fit within a longitudinal bore through the gripper body 404, in registry with the groove 430. The tab 428 includes a ramp surface 440 on a front end thereof, declined downwardly in a forward direction toward a surface of the paddle 400.

On a front surface of the gripper body 404 is a workpiece sensor 442. The workpiece sensor is a light emitting and receiving sensor which emits a light beam and, if a workpiece is present on the paddle 400, receives a light reflection from the workpiece. If no workpiece is present the reflection is not received, and a "no workpiece" signal or condition is transmitted. Preferably, the sensor 442 emits an infrared light beam.

Figure 17:
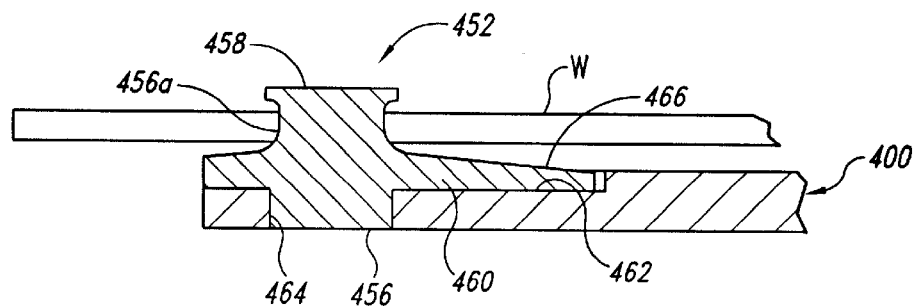
FIG. 17 is an enlarged fragmentary sectional view taken from FIG. 16, shown holding a workpiece.

At a front end of the paddle 400 are located two identical workpiece edge-gripping pins 450, 452. The pins are preferrably formed from plastic material. For simplicity, only the pin 452 will be described. As shown in FIG. 17, the pin 452 has a cylindrical body 456 with a radially extending top flange 458 and an intermediate base 460. The base 460 fits onto a stepped region 462 of the prong 403 of the paddle 400. A lower portion of the cylinder 456 is held within an aperture 464 through the prong 403, by friction, bonding, or by adhesive. The intermediate base 460 has an outwardly declined, surrounding top surface 466. When the workpiece is placed onto the paddle 400, initially before being gripped by the pins, the declined surface 466 ensures that only an edge of the workpiece will be in contact with the effector, on the declined surface 466.

Figure 18:
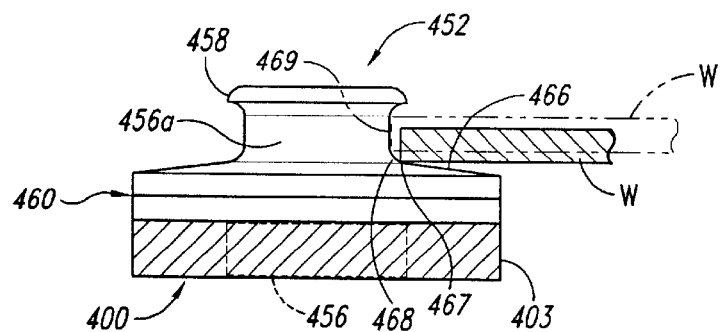
FIG. 18 is an enlarged fragmentary sectional view taken generally along line 18—18 of FIG. 15.

FIG. 18 illustrates the workpiece W (shown solid) initially resting on an edge 467 thereof on the declined surface 466. When the effector grips the workpiece against the pins 450, 452 by means of the plunger 434, an inclined annular radius 468 of the pin will vertically raise the workpiece W to be in edge contact with a vertical contact surface 456a of the pin 452. This ensures that the workpiece W is contacted by the pin substantially only on an outside edge 469 of the workpiece. In addition to the gripping force, the workpiece W is also retained vertically by the flange 458, particularly during the flipping operation.

Figure 19:
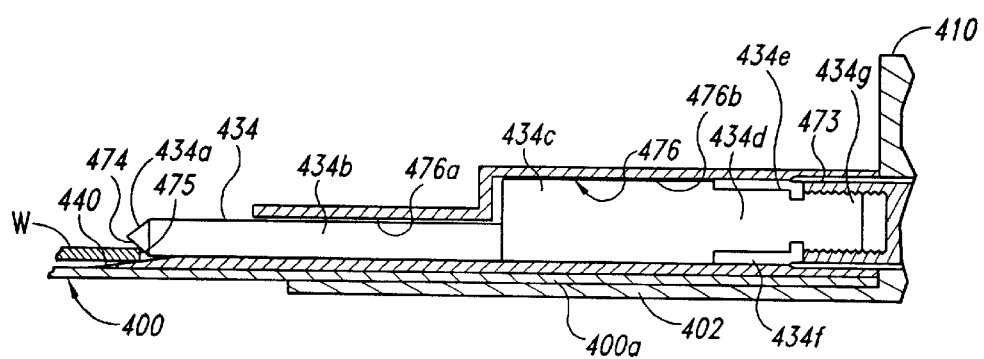
FIG. 19 is an enlarged fragmentary sectional view taken from FIG. 16.

As shown in FIG. 19 the plunger 434 includes a conical tip 434a which has an inclined portion 474 that pushes and overlies an edge 475 of the workpiece W to vertically retain the workpiece on the paddle 400. The ramp surface 440 ensures that the workpiece is only contacted on its edge 475, and does not rest on its flat back surface. When the end effector 108 is rotated about the horizontal axis R by the flip motor 302, the flanges 458 of the pins 450, 452 and the conical tip 434a of the plunger 434 ensure that the workpiece does not fall from the paddle 400.

The plunger includes a cylindrical slender forward extension 434b, which includes the tip 434a, and a cylindrical, thicker barrel portion 434c extending rearwardly therefrom. Connected to the barrel portion 434c is a cylindrical tool gripping portion 434d having opposing flat surfaces 434e, 434f for engagement of the portion 434d with a wrench. A threaded connecting end portion 434g is screwed into the threaded socket 473. The plunger 434 fits into a stepped bore 476. The stepped bore 476 includes a forward slender bore 476a for guiding the slender forward extension 434b and a rear larger bore 476b for guiding the rear barrel portion 434c.

Figure 14:
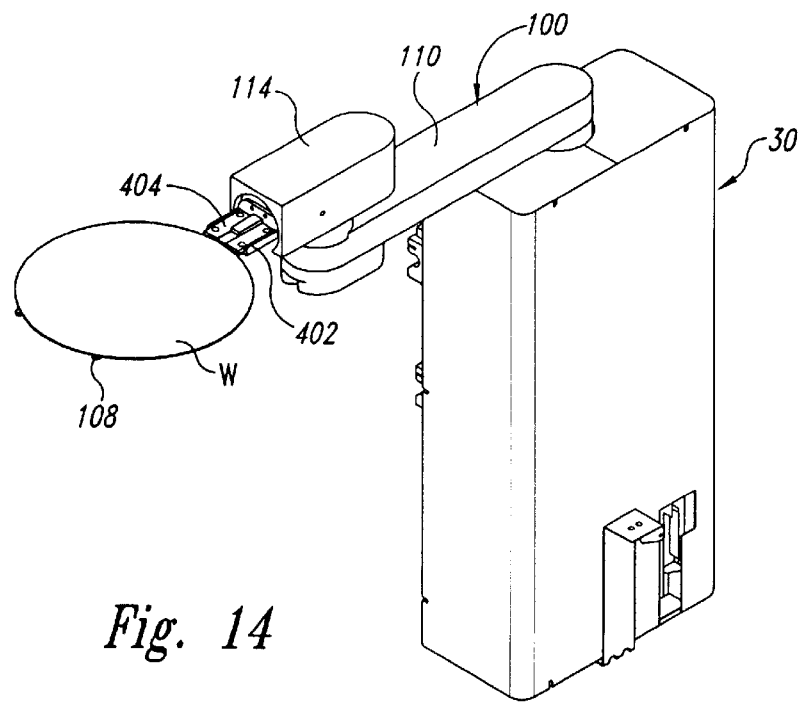
FIG. 14 is a rear perspective view of the workpiece transport unit of FIG. 4 in which the arm is in a different rotary position and in which the end effector is holding a workpiece.

Thus, in operation, when a workpiece W is placed onto the paddle 400 as shown in FIG. 14, air is released from the pneumatic cylinder 414 and the spring 470 thrusts the plunger 434 forwardly (to the left in FIG. 19). The conical tip 434a pushes the workpiece edge into the pins 450, 452. The workpiece edge is pressed into the vertical contact surface 456a of the pins and between the ramp surface 440 and the inclined surface 474. The workpiece can be released by introduction of pressurized air into the pneumatic cylinder 414, to retract the plunger 434.

Figure 20:
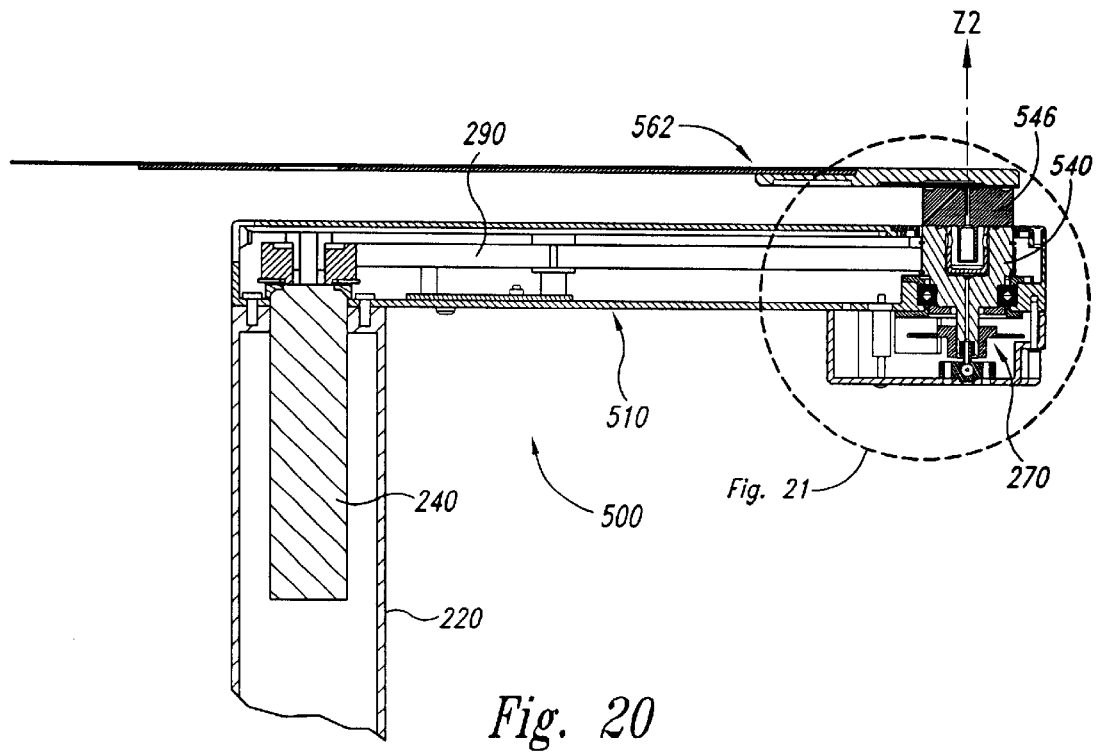
FIG. 20 is an enlarged fragmentary sectional view of an alternative embodiment robot arm.

FIG. 20 illustrates an alternative robot arm assembly 500. The robot arm assembly shares many common features with the robot arm assembly described, for example, in FIG. 8 except as described below. A first rotatable arm section 510 includes the electric motor 240 and the belt 290 for turning a wrist tube 540 about the vertical axis Z2. A vacuum chamber cap 546 is fastened to the wrist tube 540 by a plurality of vertically oriented fasteners (not shown). An end effector 562 is fastened to the vacuum chamber cap 546. Thus, turning the wrist tube 540 turns the end effector 562.

Figure 21:
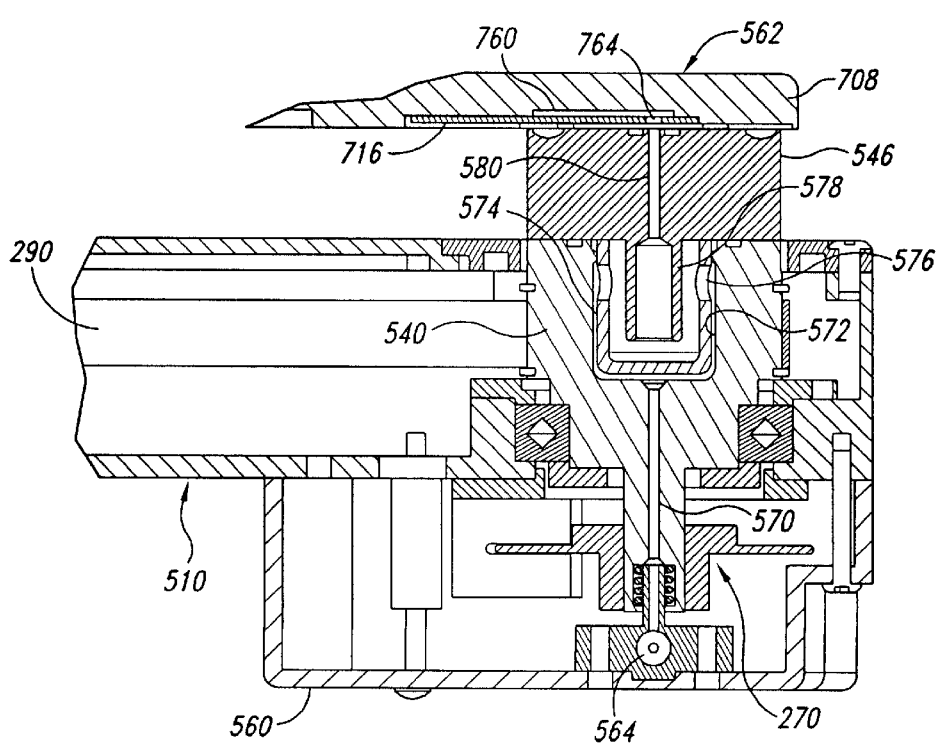
FIG. 21 is an enlarged view taken from FIG. 20.

As shown more clearly in FIG. 21, the first arm section 510 includes a housing 560 which surrounds the rotary absolute encoder 270. A pneumatic fitting 564 is exposed outside of the housing 560 for being connected to a source of vacuum, and is in flow communication with a channel 570 through the wrist tube 540. The channel is in flow communication with an indented region 572 of the wrist tube 540. The vacuum chamber cap 546 includes an inlet portion 574 which extends down into the indented region 572. The inlet portion 574 includes a plurality of ports 576 and an internal inlet nozzle 578. The inlet nozzle 578 extends upwardly into an axial channel 580 which is in flow communication with a vacuum channel 760 (described below) within the end effector 562.

Figure 22:
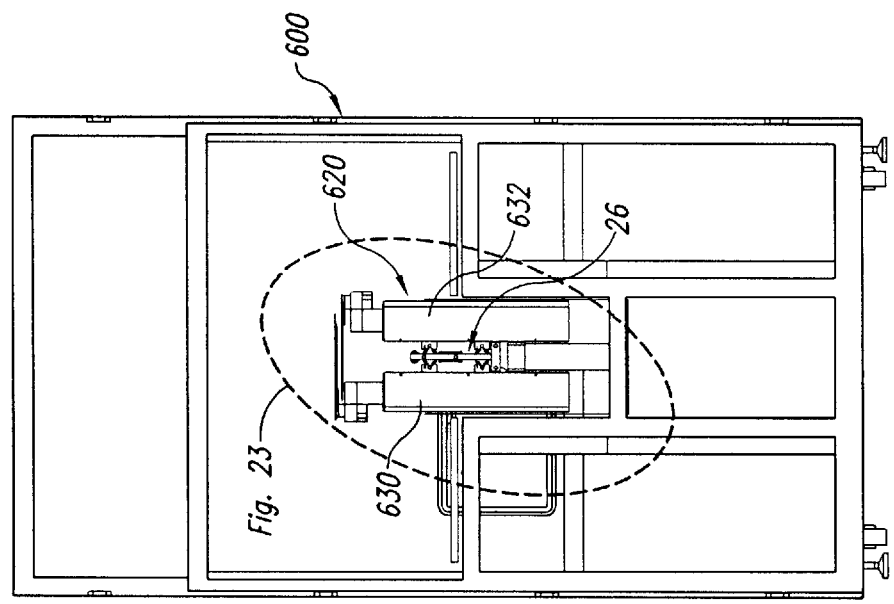
FIG. 22 is an end view of an alternative workpiece processing tool having a workpiece conveyor system using alternative transport units which incorporate the robot arms of FIG. 20.

FIG. 22 illustrates a processing tool 600 having a central workpiece conveyor system 620. The workpiece conveyor system 620 includes a workpiece transport unit guide 26 as previously described, and transport units 630, 632, one slidably mounted on each side of the guide as previously described. The workpiece transport unit 630, 632 incorporate the robot transfer arm 500 as described in FIGS. 20 and 21.

Figure 23:
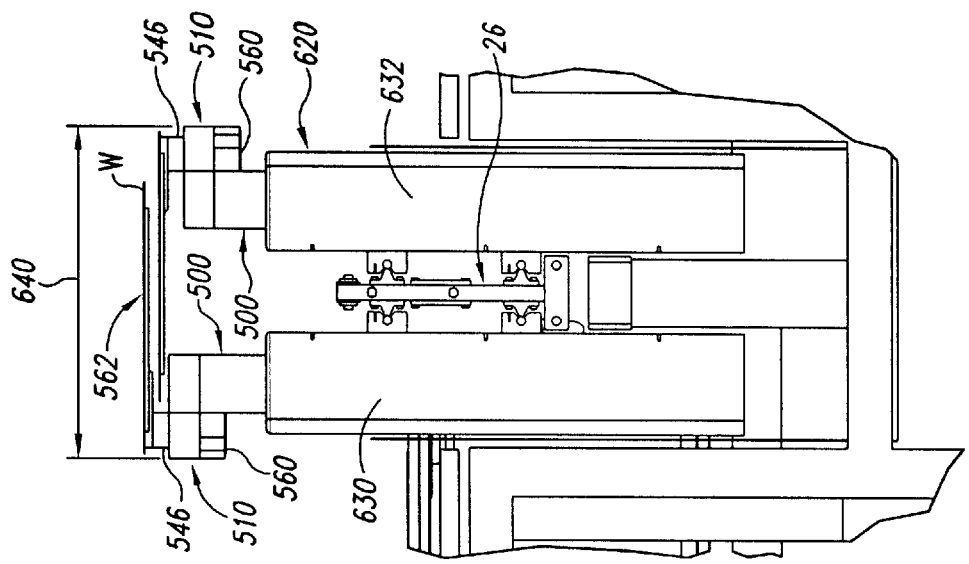
FIG. 23 is an enlarged view taken from FIG. 22.

FIG. 23 illustrates a compact lateral arrangement of the transport units 630, 631 having a lateral outside dimension 640 for compact mutual sliding along the guide rail 26. The lateral dimension 640 can be minimized because the caps 546 allow a sufficient vertical clearance, projected horizontally, between the end effectors 562 such that when the (right) robot arm 500 is maintained at a slightly lower elevation than the (left) robot arm 500, the (right) end effector 562 and wafer W held thereby can underlie the (left) end effector 562 and wafer W held thereby in close proximity to the (left) vacuum chamber cap 546. The (left) end effector 562 and wafer W held thereby can overlie the (right) end effector 522 and wafer W held thereby. The transport unit 630, 632 can both be moved along the rails of the guide rail 26 in this configuration, or can be moved separately.

Figure 24:
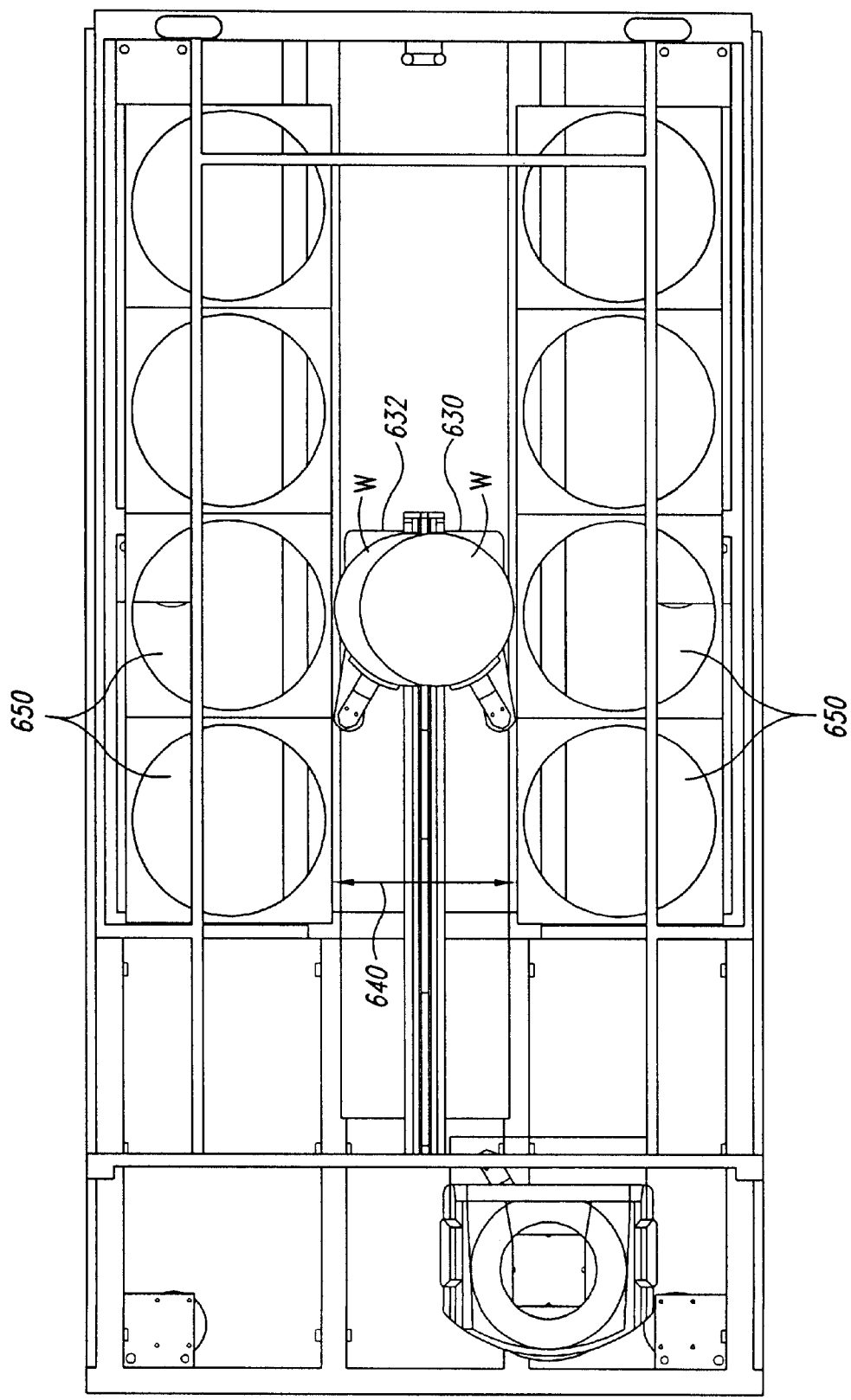
FIG. 24 is a plan view of the workpiece processing tool of FIG. 22.

FIG. 24 illustrates the (left and right) transport units 630, 632 in this compact, retracted arrangement with the wafers W at slightly different elevations. The transport units can deliver wafers to the laterally arranged process vessels 650.

The design of FIGS. 22–24 allows for simultaneous linear transfer of wafers by both robots in either direction along the rail without interference by passing one end effector and wafer over the top of the respective other robot end effector and wafer. This is accomplished by setting a safe travel zone vertically for each robot. The vacuum cap 546 of the robot arm assembly has an axially length which elevates the end effector above the first arm section 510 a distance sufficient to allow the adjacent robot end effector and wafer held thereby to pass between the first arm section 510 and respective end effector.

The result of the described configuration is a reduced tool footprint, when viewed in plan view, of approximately nine inches in width.

The embodiment shown in FIG. 8 could also be modified to extend the torque tube 260 to provide a clearance between the first arm section 110 and the end effector 108 in a similar fashion.

Figure 25:
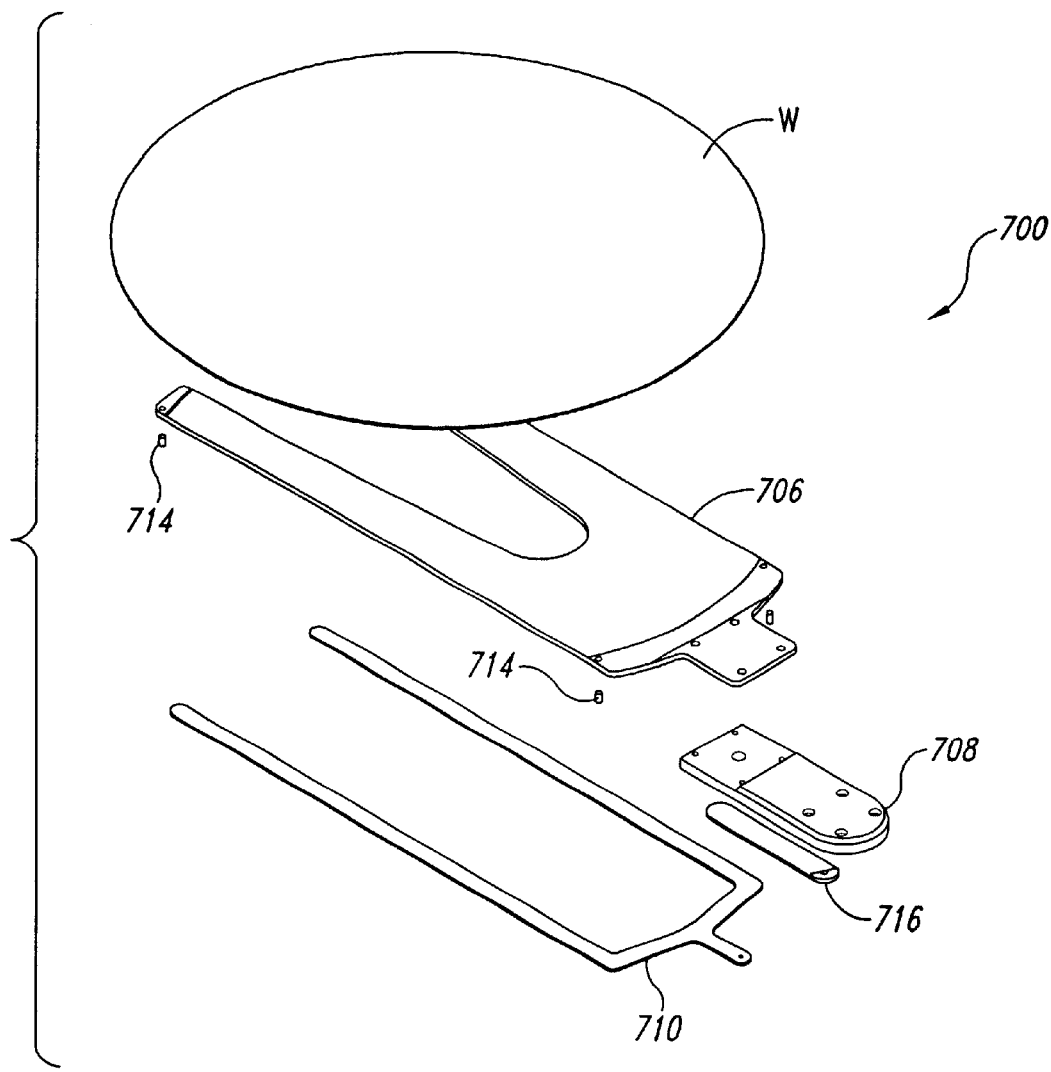
FIG. 25 is an exploded perspective view of an end effector of the robot arm shown in FIG. 20, and a workpiece.

FIG. 25 illustrates an alternative embodiment end effector 700 for gripping a workpiece such as a wafer W. The end effector 700 includes a paddle member 706 and a link member 708. The paddle member 706 is fastened to the link member 708. The paddle member 706 includes vacuum channel 740 on a bottom side thereof, which can be closed by a vacuum closeout 710. The paddle member includes four holes which receive locator pins or buttons 714 which locate the wafer W onto the paddle 706. A link member vacuum closeout 716 closes the vacuum channel 760 arranged on a bottom side of the link member (shown in FIG. 32).

Figure 26:
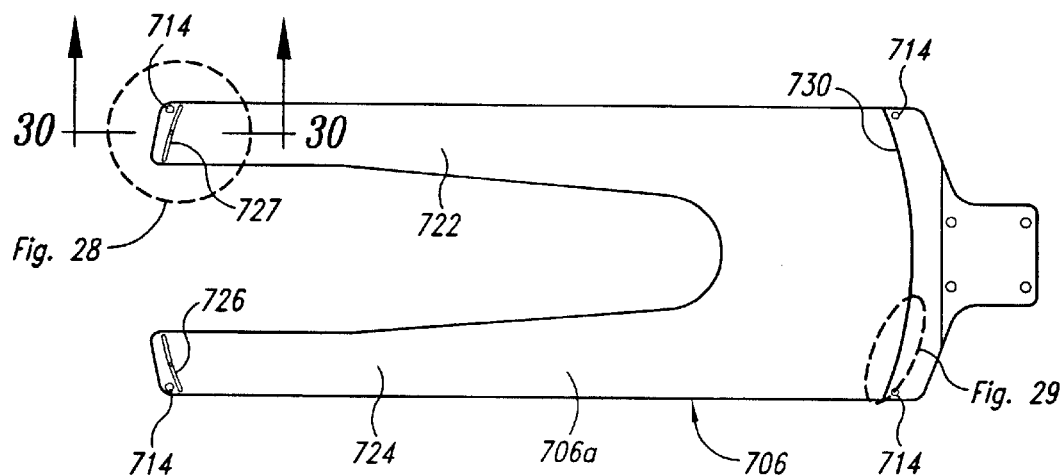
FIG. 26 is a plan view of the end effector of FIG. 25.

FIG. 26 illustrates a top surface 706a of the paddle 706. The paddle 706 includes parallel prongs 722, 724. At the distal end of the prongs are raised wafer supporting ridges or pad areas 726, 727. The locator pins 714 are located adjacent to the pad areas 726, 727. At the base end of the paddle 706 is an elongated wafer supporting ridge or pad area 730. Locator pins 714 are located at opposite ends of the pad area 730. The pad areas 726, 727, 730 circumscribe a portion of a circle which corresponds to an edge region of a wafer supported on the paddle.

Figure 27:
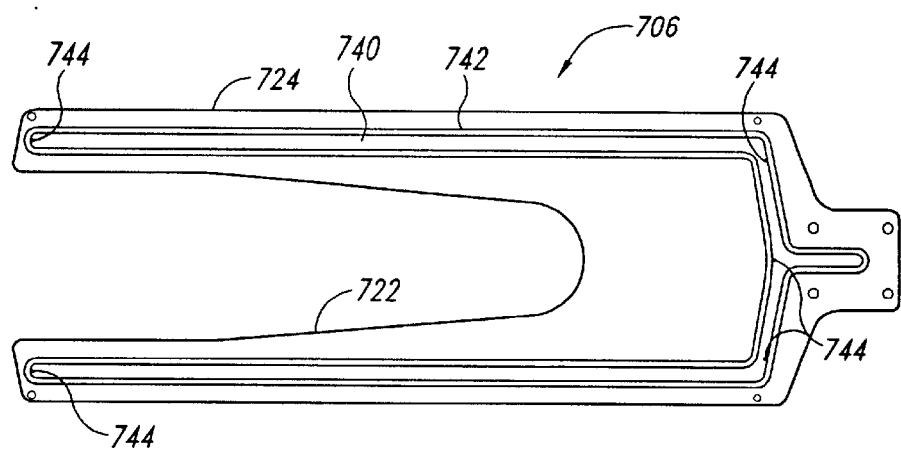
FIG. 27 is a bottom view of the end effector of FIG. 26.

FIG. 27 illustrates the bottom of the paddle member 706 which includes the elongate vacuum channel 740 which is surrounded by a recessed ledge 742 which corresponds to the shape of the vacuum closeout 710 shown in FIG. 25. Additionally, within the vacuum channel 740 are located vacuum ports or holes 744 which open the vacuum channel through a thickness of the paddle member 706 to vacuum openings in the pad areas.

Figure 28:
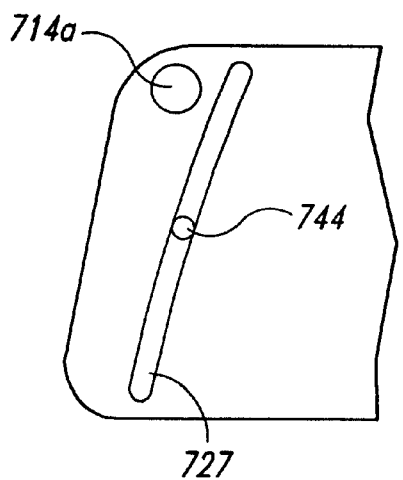
FIG. 28 is an enlarged view taken from FIG. 26.
Figure 29:
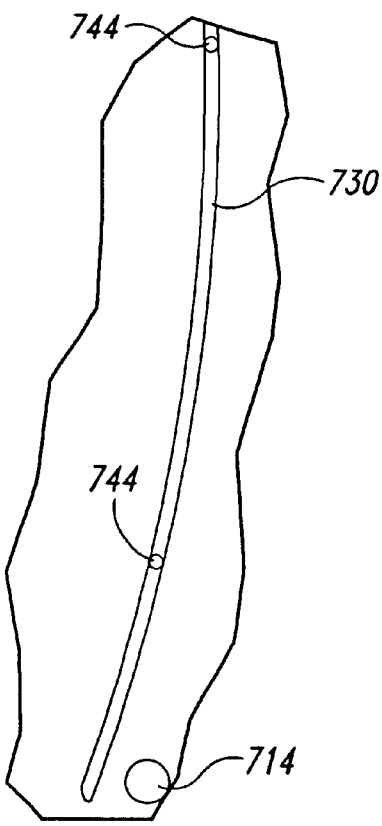
FIG. 29 is an enlarged view taken from FIG. 26.
Figure 30:
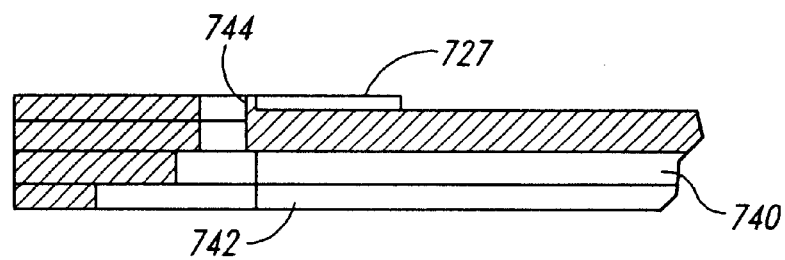
FIG. 30 is a sectional view taken along line 30—30 in FIG. 26.

FIG. 28 illustrates the pad area 727 including a vacuum port 744 therethrough which is in communication with the vacuum channel 740.

Figure 31:
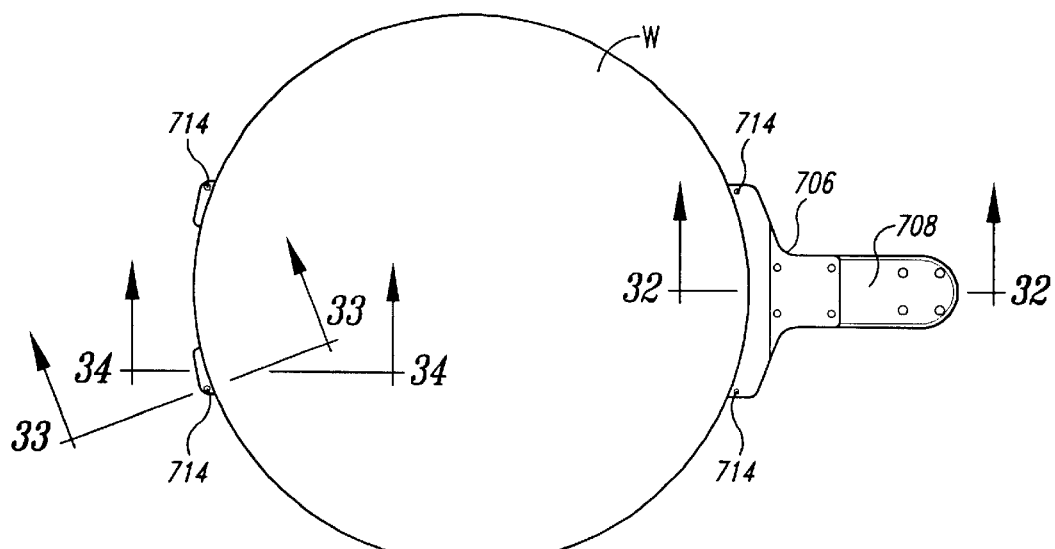
FIG. 31 is a plan view of the end effector of FIG. 25, holding a workpiece.

FIG. 31 illustrates the wafer W located between the four locator pins 714 and covering the pad areas 726, 727, 730.

Figure 32:
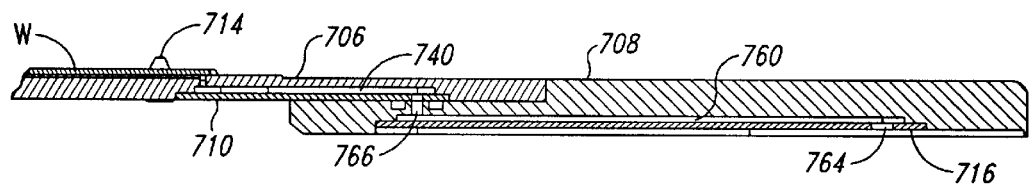
FIG. 32 is a sectional view taken along line 32—32 in FIG. 31.

FIG. 32 shows the link member vacuum closeout 716 which closes the elongate vacuum channel 760. The closeout 716 includes an inlet opening 764 and an outlet opening 766. The inlet opening 764 communicates with the vacuum chamber cap 546 as shown in FIG. 21. The opening 766 communicates with the vacuum channel 740.

Figure 33:
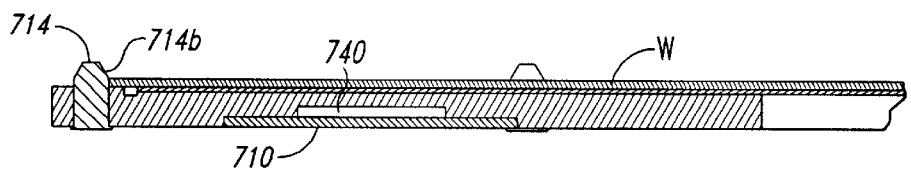
FIG. 33 is a sectional view taken along line 33—33 in FIG. 31.
Figure 34:
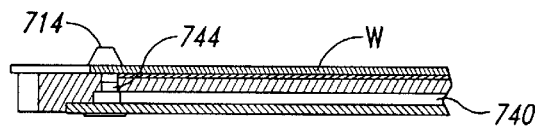
FIG. 34 is a sectional view taken along line 34—34 in FIG. 31.

FIGS. 33 and 34 illustrate one of the locator pins 714 in more detail. The locator pin 714 includes a beveled surface 714b which guides downward loading movement of the wafer W to arrive at its precisely located position adjacent to a base of the beveled surface 714b.

The end effector assembly of FIGS. 25–34 provides a vacuum manifold which communicates vacuum pressure to the three vacuum pad areas 726, 727, 730 elevated above the remaining portions of the paddle top surface 706a. The differential vacuum pressure acting on each of the vacuum pad areas provides a force to hold the wafer stationary relative to the paddle. Advantageously, the elevated vacuum pad areas contact the wafer surface only in a preselected, defined exclusion zone of 3 mm, for example. Additionally, the four buttons or locator pins 714 provide guide "furniture" with angled lead-in to precisely locate the wafer relative to the raised pad areas to assure contact only on the wafer exclusion zone.

A tool system provides the controlled vacuum source to the end effector vacuum pneumatic fitting 564 such that a vacuum pressure sensor (not shown) in the tool can detect the presence of a wafer.

The vacuum gripping end effector of FIGS. 25–34 may offer some advantages over the plunger wafer gripping mechanism of FIGS. 13 and 15–19. The plunger which actuates against the wafer may cause the wafer to slide relative to the paddle. To prevent the wafer from interfering with features in the carrier or process heads during this motion the robot must first lift the end effector up then back then actuate the plunger. The vacuum edge grips of FIGS. 25–34 simplifies robot movement by only requiring a lift up to attach the vacuum pad areas to the wafer. Additionally, the plunger type edge grip requires a wafer presence sensor system separate from the grip mechanism. This includes an electrical/optic sensor such as described with the previous embodiment, which requires wire routing through the wrist axis. Such wire routing limits a 360° rotation of the wrist.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A robot arm end effector for a holding a workpiece, comprising a substantially horizontally extending member having at least one protruding member arranged for pressing an edge of a workpiece overlying said horizontally extending member, and a movable member selectively movable between a first position to load/unload a workpiece and a second position to press the edge of the workpiece against the protruding member to grip said workpiece, wherein said at least one protruding member projects from the extending member and has a base with a declined top surface at an acute angle relative to the extending member and a top flange over the base, and wherein the top surface of the base extends beyond the top flange to hold the backside of the workpiece apart from the extending member when the moveable member is in the first position and the workpiece rests on the top surface of the base.

2. The end effector according to claim 1, wherein said horizontally extending member comprises a Y-shaped paddle and said at least one protruding body comprises two pins, each pin extending perpendicularly from one leg of said Y-shaped paddle.

3. The end effector according to claim 1, wherein said movable member comprises a plunger arranged to press the edge of the workpiece, said plunger having a angled surface pressing said edge of said workpiece.

4. The end effector according to claim 1, wherein said at least one protruding member comprises two spaced apart pins, and wherein said pins include radially extending flanges at end of said pins spaced from said horizontally extending member.

5. The end effector according to claim 4, wherein said pins include an intermediate base portion having a surface which tapers toward a receiving surface of said horizontally extending member which is closest to said workpiece, such that said workpiece is supported on an edge thereof having its bottom surface spaced from a top surface of said receiving surface.

6. The end effector according to claim 1, further comprising a workpiece presence sensor mounted to said horizontally extending member, the sensor generating a signal corresponding to the presence of a workpiece on the effector.

7. The end effector according to claim 6, wherein said workpiece presence sensor comprises light emitting and receiving components for emitting a light beam and sensing a reflection of the light beam caused by the presence of said workpiece.

8. The end effector according to claim 7, wherein said light beam generated by said emitter is an infrared beam.

9. An end-effector for carrying a microelectronic workpiece, comprising:

a paddle having a first prong;

a first edge-grip pin carried by the first prong, the first pin having a base with a top surface projecting at an angle from the first prong and a top flange above the top surface of the base, wherein the top surface of the base extends beyond the top flange; and a driver carried by the paddle, the driver moving between a first position to load/unload a workpiece and a second position to press an edge of the workpiece against the first pin.

10. The end-effector of claim 9 wherein the first pin has an intermediate contact surface between the base and the top flange for contacting the edge of the workpiece and an annular radius between the top surface of the base and the contact surface, and wherein the annular radius raises the workpiece from the top surface of the base to the contact surface as the driver moves from a retracted position to an extended position.

11. The end-effector of claim 9 wherein the paddle further comprises a second prong with a second edge-grip pin having a base with a top surface projecting at an angle from the second prong and a top flange above the top surface of the base, wherein the top surface of the base extends beyond the top flange, and wherein the first and second pins are positioned to contact the edge of the workpiece.

12. The end-effector of claim 9 wherein first pin has a vertical contact surface between the top surface of the base and the top flange.

13. An end-effector for carrying a microelectronic workpiece, comprising:

a paddle having a first location for a pin and a second location with a ramp projecting upwardly with increasing distance from the first location;

a first edge-grip pin carried by the paddle at the first location, the pin having a base with a top surface projecting away from the paddle with increasing distance from the second location and a top flange above the top surface of the base, wherein the top surface of the base extends beyond the top flange; and a driver carried by the paddle at the second location, the driver having a tip with a downwardly beveled surface, and the driver being moveable between a first position to load/unload a workpiece and a second position to hold the workpiece, wherein the beveled surface of the driver presses the workpiece downwardly against the ramp as the driver moves from the first position to the second position.

14. The end-effector of claim 13 wherein the first pin has an intermediate contact surface between the base and the top flange for contacting the edge of the workpiece and an annular radius between the top surface of the base and the contact surface, and wherein the annular radius raises the workpiece from the top surface of the base to the contact surface as the driver moves from a retracted position to an extended position.

15. The end-effector of claim 13 wherein the paddle further comprises a second prong with a second edge-grip pin having a base with a top surface projecting at an angle from the second prong and a top flange above the top surface of the base, wherein the top surface of the base extends beyond the top flange, and wherein the first and second pins are positioned to contact the edge of the workpiece.

16. The end-effector of claim 13 wherein first pin has a vertical contact surface between the top surface of the base and the top flange.

* * * * *